(12) United States Patent
Kruit et al.

(10) Patent No.: US 10,504,687 B2
(45) Date of Patent: Dec. 10, 2019

(54) SIGNAL SEPARATOR FOR A MULTI-BEAM CHARGED PARTICLE INSPECTION APPARATUS

(71) Applicants: Technische Universiteit Delft, Delft (NL); Applied Materials Israel, Ltd., Rehovot (IL)

(72) Inventors: Pieter Kruit, Delft (NL); Ron Naftali, Delft (NL)

(73) Assignees: TECHNISCHE UNIVERSITEIT DELFT (NL); APPLIED MATERIALS ISRAEL, LTD. (IL)

( * ) Notice: Subject to any disclaimer, the term of this patent is extended or adjusted under 35 U.S.C. 154(b) by 0 days.

(21) Appl. No.: 15/900,428

(22) Filed: Feb. 20, 2018

(65) Prior Publication Data

US 2019/0259564 A1    Aug. 22, 2019

(51) Int. Cl.
*H01J 37/28* (2006.01)
*H01J 37/10* (2006.01)
(Continued)

(52) U.S. Cl.
CPC ........ *H01J 37/147* (2013.01); *H01J 37/1475* (2013.01); *H01J 37/224* (2013.01);
(Continued)

(58) Field of Classification Search
CPC ........ H01J 37/28; H01J 37/3177; H01J 37/10; H01J 37/141; H01J 37/143; H01J 37/1474;
(Continued)

(56) References Cited

U.S. PATENT DOCUMENTS

| 3,371,206 A | * | 2/1968 | Takizawa | ........... B23K 15/0013 |
| | | | | 219/121.26 |
| 5,834,786 A | * | 11/1998 | White | ................... H01J 37/304 |
| | | | | 250/492.21 |

(Continued)

FOREIGN PATENT DOCUMENTS

| JP | 6-349429 | 12/1994 | ........... H01L 21/265 |
| JP | 2000-182525 | 6/2000 | ............... H01J 27/02 |
| WO | WO9926272 | 5/1999 | ............... H01J 37/04 |

OTHER PUBLICATIONS

International Search Report and Written Opinion issued in application No. PCT/NL2019/050099, dated Jun. 26, 2019 (20 pgs).

*Primary Examiner* — David A Vanore
(74) *Attorney, Agent, or Firm* — Hayes Soloway P.C.

(57) ABSTRACT

A multi-beam charged particle column for inspecting a surface of a sample includes a source for creating multiple primary charged particle beams which are directed towards the sample, an objective lens unit for focusing the primary charged particle beams on the sample, a detector for detecting signal charged particles from the sample, and a magnetic deflection unit arranged between the detector and the sample. The magnetic deflection unit includes a plurality of strips of a magnetic or ferromagnetic material. At least two strips of the plurality of strips are located at opposite sides of a trajectory of a primary charged particle beam and within a distance equal to a pitch of the trajectories of the primary charged particle beams at the magnetic deflection unit. The strips are configured to establish a magnetic field having field lines substantially perpendicular to the trajectories of the primary charged particle beams.

24 Claims, 10 Drawing Sheets

(51) Int. Cl.
  *B82Y 10/00*   (2011.01)
  *H01J 37/147*  (2006.01)
  *H01J 37/22*   (2006.01)
  *H01J 37/244*  (2006.01)

(52) U.S. Cl.
  CPC .......... *H01J 37/226* (2013.01); *H01J 37/244* (2013.01); *H01J 37/28* (2013.01); *H01J 2237/151* (2013.01); *H01J 2237/152* (2013.01); *H01J 2237/1508* (2013.01); *H01J 2237/2445* (2013.01); *H01J 2237/2448* (2013.01); *H01J 2237/24592* (2013.01)

(58) Field of Classification Search
  CPC .......... H01J 37/1475; H01J 2237/0635; H01J 2237/0822; H01J 2237/0492; H01J 2237/055; H01J 2237/057; H01J 2237/14; H01J 2237/152; H01J 2237/31774; B82Y 10/00; B82Y 40/00
  USPC .......... 250/396 R, 396 ML, 398, 310, 492.2, 250/492.21, 492.3, 252.1, 306, 307, 311, 250/346, 49, 1.1, 492.1, 503.1
  See application file for complete search history.

(56) References Cited

U.S. PATENT DOCUMENTS

| | | | | |
|---|---|---|---|---|
| 6,774,646 B1* | 8/2004 | Han | ................ | G01N 23/04 324/754.22 |
| 6,797,969 B2* | 9/2004 | Gerlach | ................ | H01J 37/08 250/396 R |
| 7,638,777 B2* | 12/2009 | Feuerbaum | ............ | B82Y 10/00 250/310 |
| 9,053,906 B2* | 6/2015 | Platzgummer | ...... | H01J 37/3026 |
| 9,922,796 B1* | 3/2018 | Frosien | ................ | H01J 37/09 |
| 2001/0032938 A1* | 10/2001 | Gerlach | ................ | H01J 37/08 250/492.3 |
| 2003/0001095 A1* | 1/2003 | Lo | ................ | B82Y 10/00 250/346 |
| 2003/0209676 A1* | 11/2003 | Loschner | ................ | B82Y 10/00 250/492.2 |
| 2006/0169910 A1 | 8/2006 | Frosien et al. | ............ | H01J 1/50 |
| 2009/0152460 A1* | 6/2009 | Buhler | ................ | H01J 37/3056 250/306 |
| 2009/0200497 A1* | 8/2009 | Adamec | ................ | H01J 37/244 250/503.1 |
| 2010/0001204 A1* | 1/2010 | White | ................ | H01J 37/147 250/398 |
| 2010/0084566 A1* | 4/2010 | Kim | ................ | B82Y 10/00 250/396 ML |
| 2010/0320382 A1* | 12/2010 | Almogy | ................ | H01J 37/05 250/307 |
| 2011/0163229 A1* | 7/2011 | Frosien | ................ | H01J 37/05 250/310 |
| 2011/0272577 A1 | 11/2011 | Lanio et al. | | |
| 2013/0112890 A1* | 5/2013 | Parker | ................ | H01J 37/05 250/396 R |
| 2015/0021476 A1* | 1/2015 | Shanel | ................ | H01J 37/26 250/310 |
| 2015/0069259 A1 | 3/2015 | Chatoor et al. | ......... | G21K 1/093 |
| 2016/0314931 A1* | 10/2016 | Fichter | ................ | H01J 37/241 |
| 2017/0213697 A1* | 7/2017 | Litman | ................ | H01J 37/285 |
| 2017/0243717 A1* | 8/2017 | Kruit | ................ | H01J 37/28 |
| 2018/0315578 A1* | 11/2018 | Rand | ................ | H01J 37/1475 |

* cited by examiner

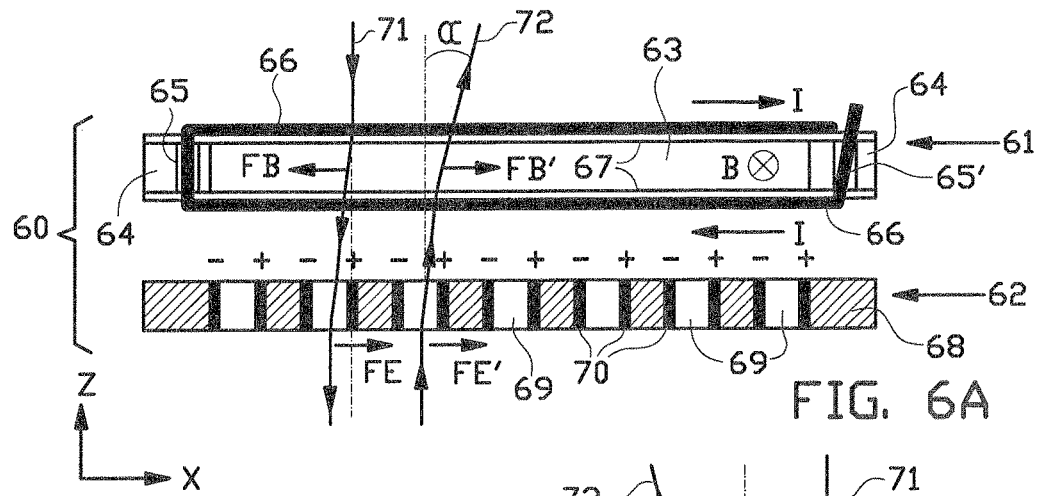
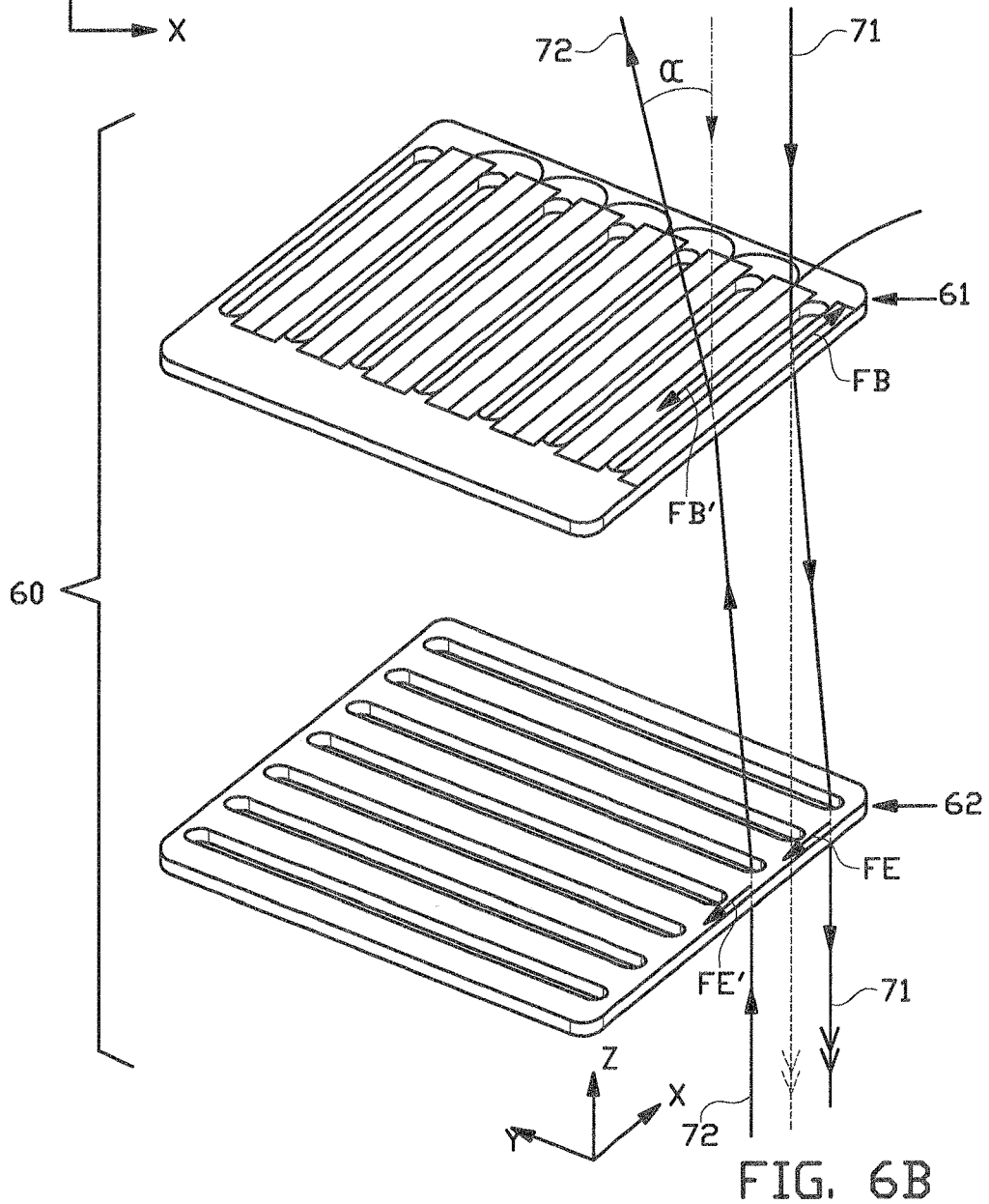
FIG. 6A
FIG. 6B

SIGNAL SEPARATOR FOR A MULTI-BEAM CHARGED PARTICLE INSPECTION APPARATUS

Embodiments of the invention relate to a signal separator for use in a multi-beam charged particle inspection apparatus. Embodiments of the invention further relate to a multi-beam charged particle inspection apparatus comprising such a signal separator and a method for inspecting a surface of a sample, using such a multi-beam charged particle inspection apparatus.

BACKGROUND

One of the routine steps in the production process of integrated circuits is the inspection of patterned surfaces, especially when starting up a new design. A substantial part of the whole 300 mm wafer is imaged to check for defects in the pattern and for particles imbedded in the pattern or on top of the wafer. This kind of inspection is presently performed by high-throughput optical microscopy in dedicated instruments.

With the progress in lithography, the instruments must detect smaller and smaller defects and particles. A problem is that the light scattering from particles rapidly decreases when the particle's size decreases, so the signal-to-background (and noise) ratio is decreasing.

In order to solve this problem, electron beam inspection machines have been used and for some purposes are still in use. Electron beam inspection machines can have a much higher resolution than optical system. However, electron beam inspection machines are limited in the speed at which the electron beam inspection machines can inspect a wafer. In order to increase the speed, multi-beam electron beam systems have been proposed.

U.S. Pat. No. 6,774,646 describes a method and an apparatus for inspecting samples. The method uses an electron beam inspection system using multiple electron beams. The apparatus comprises an electro-magnet to establish a magnetic focusing field which is generated in the direction of the axis of the electron beams. The magnetic field is created by using two pole-pieces, one located above the electron emitters and one located under the stage which carries the sample. The method further uses an electrostatic deflection field, which is generated in a direction perpendicular to the magnetic field by using two plates positioned on opposite sides of the electron beam trajectory. The deflection force produced by the combined effect of the electrical and magnetic fields (E×B) is a deflection in the lateral direction, which is deflection is also used to disentangle the beam path of the primary electrons which are directed towards the sample, and the beam path of the secondary electrons which are directed towards the detector array.

SUMMARY

A disadvantage of the system as disclosed in U.S. Pat. No. 6,774,646 is, that it requires large pole pieces which are arranged above and below the electron beam inspections assembly, to provide a uniform magnetic field, which large pole pieces result is a bulky and extremely heavy system.

It is an object to least partially solve at least one of the above identified disadvantages and/or to provide an alternative inspection apparatus, which allows for high throughput inspection of samples, in particular semiconductor wafers.

According to a first aspect, a multi-beam charged particle column for inspecting a surface of a sample is provided, which multi-beam charged particle column comprising:

one or more emitters which are arranged for creating multiple primary charged particle beams directed along trajectories towards the surface of the sample arranged on a sample holder, an objective lens unit for focusing said multiple primary charged particle beams on said sample, a detector system for detecting signal charged particles created upon incidence of the primary charged particle beams on said sample, and a magnetic deflection unit arranged between the detector system and the sample holder, wherein the magnetic deflection unit comprises a plurality of strips of a magnetic or ferromagnetic material, wherein each strip of said plurality of strips is located next to a trajectory of a primary charged particle beam and within a distance equal to a pitch of the trajectories of the primary charged particle beams at the magnetic deflection unit, wherein the plurality of strips of a magnetic or ferromagnetic material is configured to establish a magnetic field having field lines which cross the trajectories of the primary charged particle beams at an angle which is larger than 0 degrees.

A charged particle with charge q traversing a magnetic field B with a velocity v will experience a magnetic force F equal to $F=qv \times B$ wherein x represents the cross product and bold symbols represent a vector. Accordingly, F is directed in a direction perpendicular to a plane defined by the direction of the velocity and the direction of the magnetic field. In use, the primary charged particles travel from the emitter towards the sample, whereas the signal charged particles travel from the sample back towards the detector system. Because the velocities of the primary charged particles and the signal charged particles are substantially in opposite directions, the magnetic force on the primary charged particles is substantially in an opposite direction of the magnetic force on the signal charged particles. Accordingly, the magnetic field provides a means for disentangling the signal charged particles from the trajectory of the primary charged particles.

Embodiments of the present invention allow to arrange the magnetic deflector unit within the charged particle column, in particular between the detector system and the sample holder. It is noted that the detector system is preferably arranged between the emitter and the sample holder. In an embodiment, the angle between the field lines of the magnetic field and the trajectories of the primary charged particle beams is larger than 45 degrees, preferably the angle is approximately 90 degrees. The inverter realized that even a small magnetic force can provide a suitable difference in deflection between the primary charged particle beam and the signal charged particle beam to disentangle the signal charged particle beams from the trajectories of the primary charged particles, in particular when the detector is arranged next to the trajectories of the primary charged particle beams, in particular in between adjacent trajectories of the primary charged particle beams. Accordingly, the magnetic deflector unit can be made sufficiently small to place the magnetic deflector unit within the charged particle column. The resulting multi-beam charged particle inspection apparatus can be made much less bulky and less heavy when compared to the apparatus as described in U.S. Pat. No. 6,774,646.

In an embodiment, the multi-beam charged particle column comprises a collimator lens for substantially collimating the primary charged particle beams from the emitter. In an embodiment, the detector is preferably arranged between the collimator lens and the sample holder, more preferably arranged between the collimator and the objective lens unit.

In an embodiment, at least two strips of said plurality of strips are located at opposite sides of a trajectory of a primary charged particle beam and within a distance equal to a pitch of the trajectories of the primary charged particle beams at the magnetic deflection unit. Preferably the pitch of the two strips is substantially equal to the pitch of the trajectories of the primary charged particle beams.

In an embodiment, the plurality of strips of the magnetic deflection unit are arranged in a common plane, wherein said strips comprises a magnetic material, and wherein at least one of said strips comprises a north and south magnetic poles which are arranged adjacent in a direction substantially parallel to the common plane. The magnetic deflection unit of this embodiment comprises permanent magnets for providing the magnetic field used to disentangle the signal charged particles from the trajectories of the primary charged particle beams. Preferably each one of said strips comprises a permanent magnet with a north and south magnetic poles which are arranged adjacent in a direction substantially parallel to the common plane.

In an embodiment, a first strip and an adjacent second strip of said plurality of strips are arranged at opposite sides of at least one of said trajectories of the primary charged particle beams, wherein the first strip is configured to comprise a north magnetic pole at a side facing the trajectory of the primary charged particle beam, and wherein the second strip is configured to comprise a south magnetic pole at a side facing the at least one of said trajectories of the primary charged particle beams. Accordingly the north magnetic pole of the first strip of said adjacent strips is facing the south magnetic pole of the second strip. This provides a substantially homogeneous permanent magnetic field between said two adjacent strips with field lines which extend from the north magnetic pole of the first strip to the south magnetic pole of the second strip.

In an alternative embodiment, the plurality of strips of the magnetic deflection unit are arranged in a common plane, wherein said strips comprises a ferromagnetic material, and wherein at least one of said strips is provided with at least two electric wires which extend in a direction substantially parallel to the common plane, wherein the two electric wires are arranged in a plane substantially perpendicular to the common plane, and wherein the magnetic deflection unit is configured to provide an electrical current to the two electric wires wherein the electrical current is configured to flow through the two electric wires in opposite direction. Accordingly, the strips of ferromagnetic are configured as a core for electromagnets. The magnetic deflection unit is provided with electromagnets which are formed by the electric wires and the strips of ferromagnetic material as cores of the electromagnets. An advantage of the use of electromagnets in the magnetic deflection unit is, that the strength of the magnetic field can be controlled by controlling the magnitude of the electrical current through the electric wires.

In an embodiment, the two electric wires are part of a single loop, preferably the two electric wires are part of a single coil. As already indicated above, the magnetic field does not need to be very strong and even a single loop around the core of ferromagnetic material can be enough to obtain the predetermined strength of the magnetic field to disentangle the signal charged particles from the trajectories of the primary charged particle beams.

In an embodiment, the detector system comprises a plurality of detector sections, wherein at least one detector section of said plurality of detector sections is located next to a trajectory of a primary charged particle beam and within a distance equal to a pitch of the primary charged particle beams at the detector system.

In an embodiment, the detector system comprises an electron-photon converter unit comprising a plurality of electron to photon converter sections, wherein at least one electron to photon converter section of said plurality of electron to photon converter sections is located next to a trajectory of a primary charged particle beam and within a distance equal to a pitch of trajectories of the primary charged particle beams at the electron-photon converter unit, and a photon transport unit for transporting light from said electron to photon converter sections to a light detector. Preferably, at least one electron to photon converter section of said plurality of electron to photon converter sections is arranged between the trajectories of two adjacent primary charged particle beams of said multiple primary charged particle beams. Preferably, said photon transport unit comprises a plurality of optical fibers.

In an embodiment, the magnetic deflection unit is configured for separating said primary charged particle beam and said signal charged particles at the position of detector system over a distance between 10% and 90% of the pitch of said primary charged particle beams, preferably over a distance substantially equal to 50% of the pitch of said primary charged particle beams. Accordingly the magnetic deflection unit is arranged for deflecting the signal charged particles at a position at the detector system in between the trajectories of the primary charged particle beams, preferably half way between the trajectories of the primary charged particle beams.

In an embodiment, the magnetic deflection unit is at least substantially surrounded by a frame of ferromagnetic material, which is configured to close the magnetic flux lines outside a volume occupied by the trajectories of the charged particle beams. The returning magnetic fields are effectively confined within said frame of ferromagnetic material and the effect of magnetic stray fields is at least reduced, and preferably substantially nullified.

In an embodiment, the magnetic deflection unit further comprises an electrostatic deflection member which is configured for creating an electrostatic field acting at least on the primary charged particle beams. Contrarily to the magnetic field, an electrostatic field deflects a charged particle beam independent on the direction of the velocity of the charged particles. When the charge of the primary charged particles and the signal charged particles have the same sign (positive or negative), the deflection of the signal charged particles is in the same direction as the deflection of the primary charged particles.

In an embodiment, the electrostatic deflection member is configured to provide an electrostatic field in a direction at least substantially perpendicular to the magnetic field. In an embodiment, the electrostatic deflection member is configured to provide an electrostatic field in a direction at least substantially parallel to at least one strip of the plurality of strips of a magnetic or ferromagnetic material. Preferably, both the electrostatic field and the magnetic field are arranged to extend in a plane substantially perpendicular to the trajectories of the primary charged particle beams at the magnetic deflection unit. In an embodiment, the electrostatic deflection member is configured to provide an electrostatic field which at least substantially compensates a deflection of the primary charged particle beams by the magnetic field of the magnetic deflection unit. According to this embodiment, the electrostatic field is configured to provide a deflection to the primary charged particle beams which is at least substantially equal but opposite to the deflection by the magnetic field. Accordingly, the trajectory of the primary charged particle beams after the primary charged particle beams traversed the magnetic deflection unit with the electrostatic deflection member, is substantially parallel to the trajectory of the primary charged particle beams before the magnetic deflection unit. However for the signal charged particles, the deflection of the magnetic field is substantially in the same direction as the deflection of the electrostatic field and both deflections add up and the signal charged particles are directed away from the trajectories of the primary charged particles.

In an embodiment, the electrostatic deflection member is arranged adjacent to the plurality of strips of a magnetic or ferromagnetic material, at least in a direction parallel to the trajectory of the primary charged particle beams. By arranging the electrostatic deflection member close to the plurality of strips, any shift of the trajectories of the primary charged particle beams can be made as small as possible, so that the primary charged particle beams traverse the magnetic deflection unit with the electrostatic deflection member, substantially undisturbed.

In an embodiment, the primary charged particles comprises electrons. In an embodiment, the signal charged particles comprises backscattered and/or secondary electrons.

According to a second aspect, a magnetic deflection unit is provided, which magnetic deflection unit comprises a plurality of strips of a magnetic or ferromagnetic material, wherein the strips of said plurality of strips are arranged spaced apart and in a common plane, wherein the plurality of strips of a magnetic or ferromagnetic material is configured to establish a magnetic field in between the strips having field lines which extend substantially parallel to said common plane.

In an embodiment, the magnetic deflection unit is configured for use in a multi-beam charged particle column or an embodiment thereof as described above. In particular, said multi-beam charged particle column comprises:

one or more emitters which are arranged for creating multiple primary charged particle beams directed along trajectories towards the surface of the sample arranged on a sample holder, an objective lens unit for focusing said multiple primary charged particle beams on said sample, a detector system for detecting signal charged particles created upon incidence of the primary charged particle beams on said sample, and a magnetic deflection unit arranged between the detector system and the sample holder, wherein each strip of said plurality of strips is located next to a trajectory of a primary charged particle beam and within a distance equal to a pitch of the trajectories of the primary charged particle beams at the magnetic deflection unit, wherein the plurality of strips of a magnetic or ferromagnetic material is configured to establish a magnetic field having field lines which cross a trajectory of the primary charged particle beams at an angle which is larger than 0 degrees.

According to a third aspect, a use of a multi-beam charged particle column, in particularly a multi-beam charged particle column or an embodiment thereof as described above, for inspecting and/or imaging the surface of a sample, preferably the surface of a single semiconductor wafer, is provided.

According to a fourth aspect, a method for inspecting or imaging a surface of a sample is provided. Said method comprises the steps of:

creating multiple primary charged particle beams directed along trajectories towards the surface of the sample arranged on a sample holder;

focusing said multiple primary charged particle beams on said sample;

establishing a magnetic field having field lines which cross a trajectory of the primary charged particle beams at an angle which is larger than 0 degrees, by using a magnetic deflection unit arranged between the detector system and the sample holder, wherein the magnetic deflection unit comprises a plurality of strips of a magnetic or ferromagnetic material, wherein each strip of said plurality of strips is located next to a trajectory of a primary charged particle beam and within a distance equal to a pitch of the trajectories of the primary charged particle beams at the magnetic deflection unit, and detecting signal charged particles created upon incidence of the primary charged particle beams on said sample, by using a detector system.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

Embodiments of the invention will be elucidated on the basis of an exemplary embodiment shown in the attached drawings, in which:

FIGS. 6A and 6B schematically show different views of an example of a deflection unit comprising a magnetic and electrostatic deflector, FIG. 7 schematically shows a view of a third example of a magnetic deflector according to the present invention, FIGS. 8A and 8B schematically show different views of a fourth example of a magnetic deflector according to the present invention, FIG. 9 schematically shows an example of a deflection unit comprising a electrostatic, magnetic and electrostatic deflector, FIG. 10 schematically shows an example of a deflection unit comprising two magnetic deflectors, FIG. 11 schematically shows a first example of a detector system as arranged in the XY plane of a part of the multi-beam charged particle column of FIGS. 2 and 3, FIG. 12 schematically shows detailed view of a part of a second example of a part of a detector system with a photon transport unit, and FIG. 13 schematically shows a detailed view of a third example of a detector system as arranged in the XZ plane of a part of the multi-beam charged particle column according to the invention.

DETAILED DESCRIPTION

Figure 1:
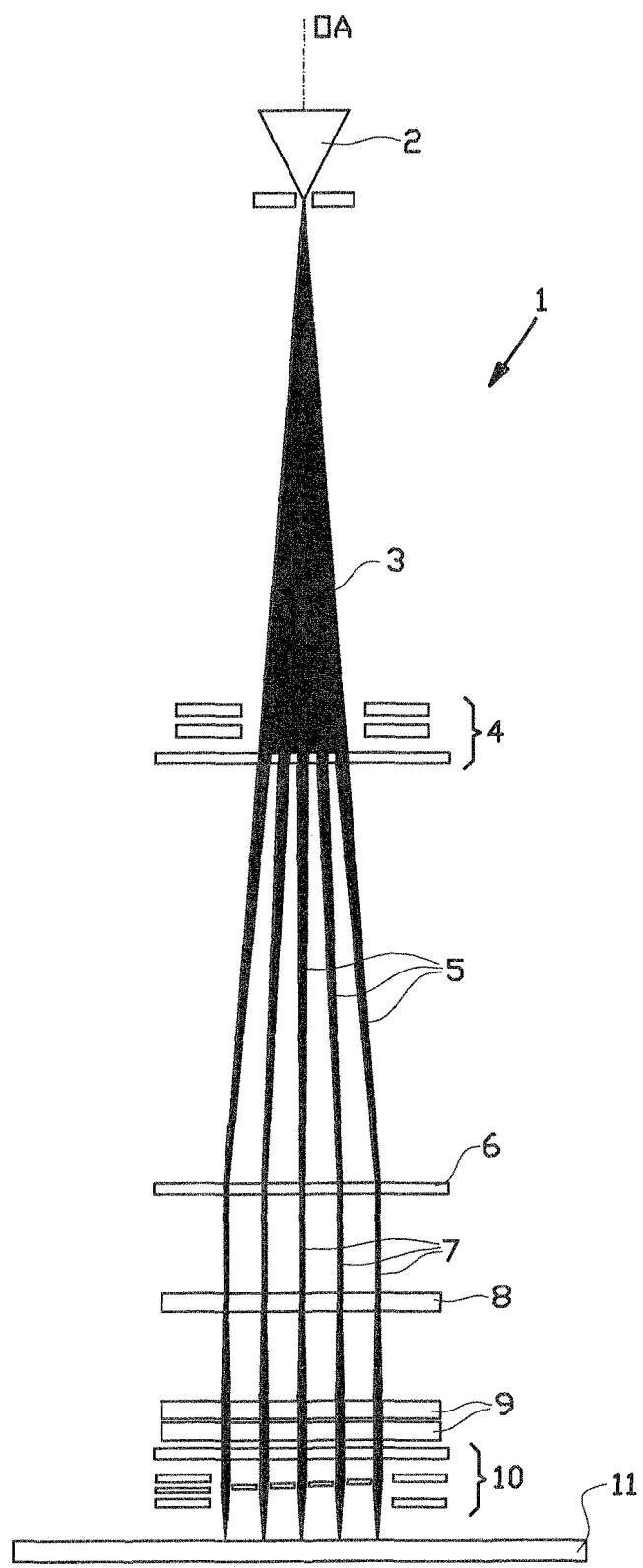
FIG. 1 schematically shows an example of a multi-beam charged particle column.

FIG. 1 shows a schematic representation of a multi-beam charged particle column 1 comprising an emitter 2, which is arranged substantially on an optical axis OA, for generating a diverging charged particle beam 3 which extends along said optical axis OA. Preferably, said emitter 2 comprises a Schottky source.

Downstream from said emitter 2, a lens array 4 is provided, which lens array 4 is provided with an aperture array for splitting the diverging charged particle beam 3 in multiple primary charged particle beams 5; each aperture of said aperture array provides one primary charged particle beam 5. In addition the lenses of the lens array 4 focuses each individual primary charged particle beam 5 at or near a collimator lens 6, which is arranged at a side of the lens array 4 facing away from the emitter 2.

Accordingly, the emitter 2 and the lens array 4 constitutes an arrangement for creating multiple primary charged particle beams 5, which multiple primary charged particle beams 5 are directed towards the surface of a sample 11.

The collimator lens 6 is arranged for substantially collimating the primary charged particle beams 5 from the emitter 2, in particular to direct each primary charged particle beam 5 substantially parallel to the optical axis OA. In embodiment, the collimator lens 6 comprises a deflector array which is arranged for deflecting the individual primary charged particle beams 5, in order to produce an array of primary charged particle beams 7 which are arranged substantially parallel to the optical axis OA as schematically shown in FIG. 1. Although a collimator is not strictly necessary, it makes the positioning of the components at the side of the collimator 6 facing away from the emitter 2, such as the objective lens unit, much less critical, at least in a direction along the optical axis OA.

Subsequently, a detector array 8 is arranged at the optical axis OA, which detector array 8 will be described in more detail with reference to FIGS. 2, 3 and 4 below. As schematically shown in FIG. 1, the detector array 8 is arranged to allow the primary charged particle beams 7 to travel through the detector array 8 towards an objective lens unit 10.

The objective lens unit 10 is arranged for focusing each one of said multiple primary charged particle beams 7 on said sample 11.

In between the objective lens unit 10 and the detector array 8, a magnetic deflection unit 9, such as a Wien deflector array, is arranged. In use, the magnetic deflection unit 9, such as the Wien deflector array, provides at least a magnetic field to disentangle the primary charged particle beams 7 and secondary electron beams coming from the surface of the sample 11 upon incidence of the primary charged particle beams 7, as will be explained in more detail below.

Figure 2:
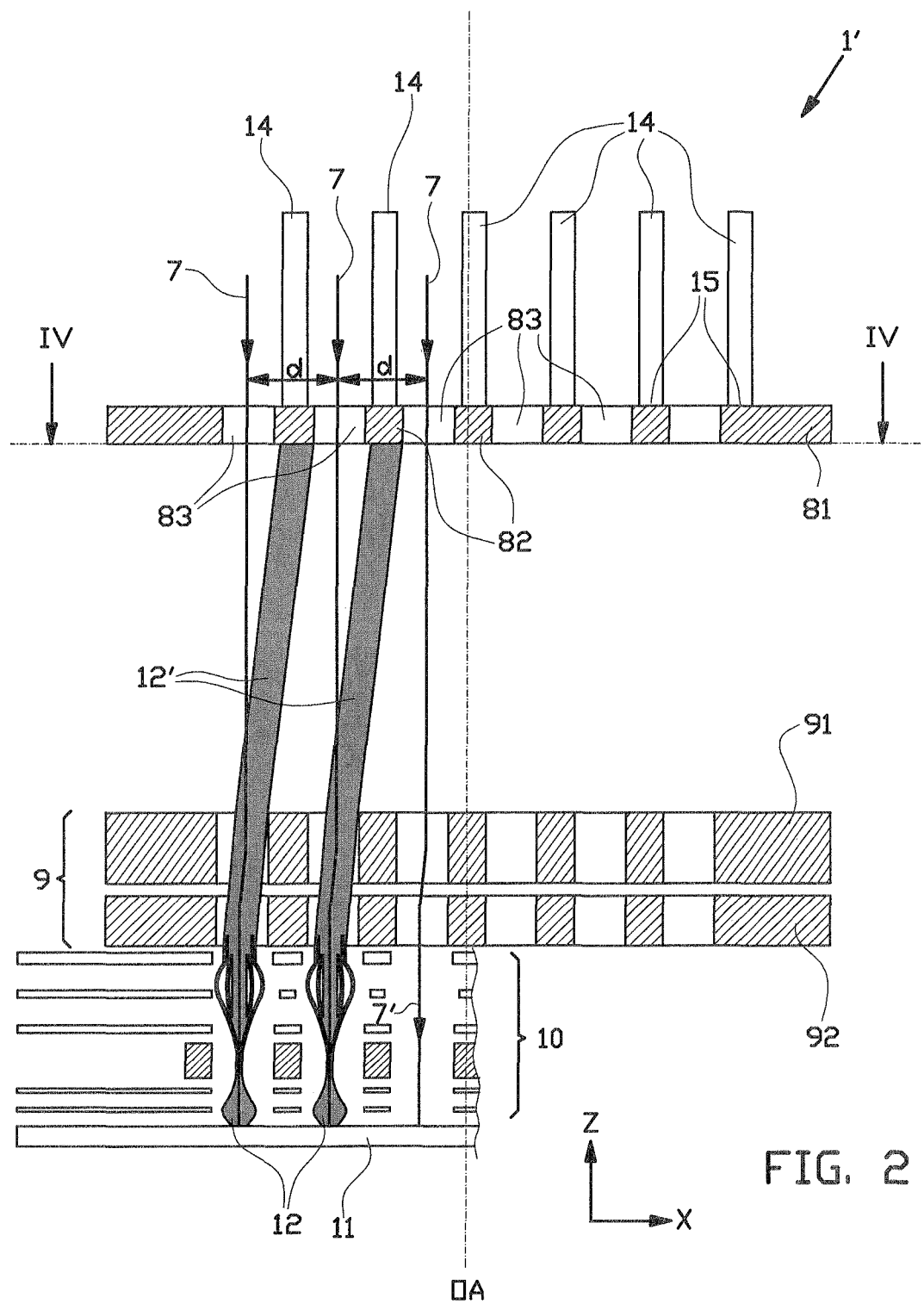
FIG. 2 schematically shows a first detailed view in the XZ plane of a part of the multi-beam charged particle column according to embodiments of the invention.
Figure 3:
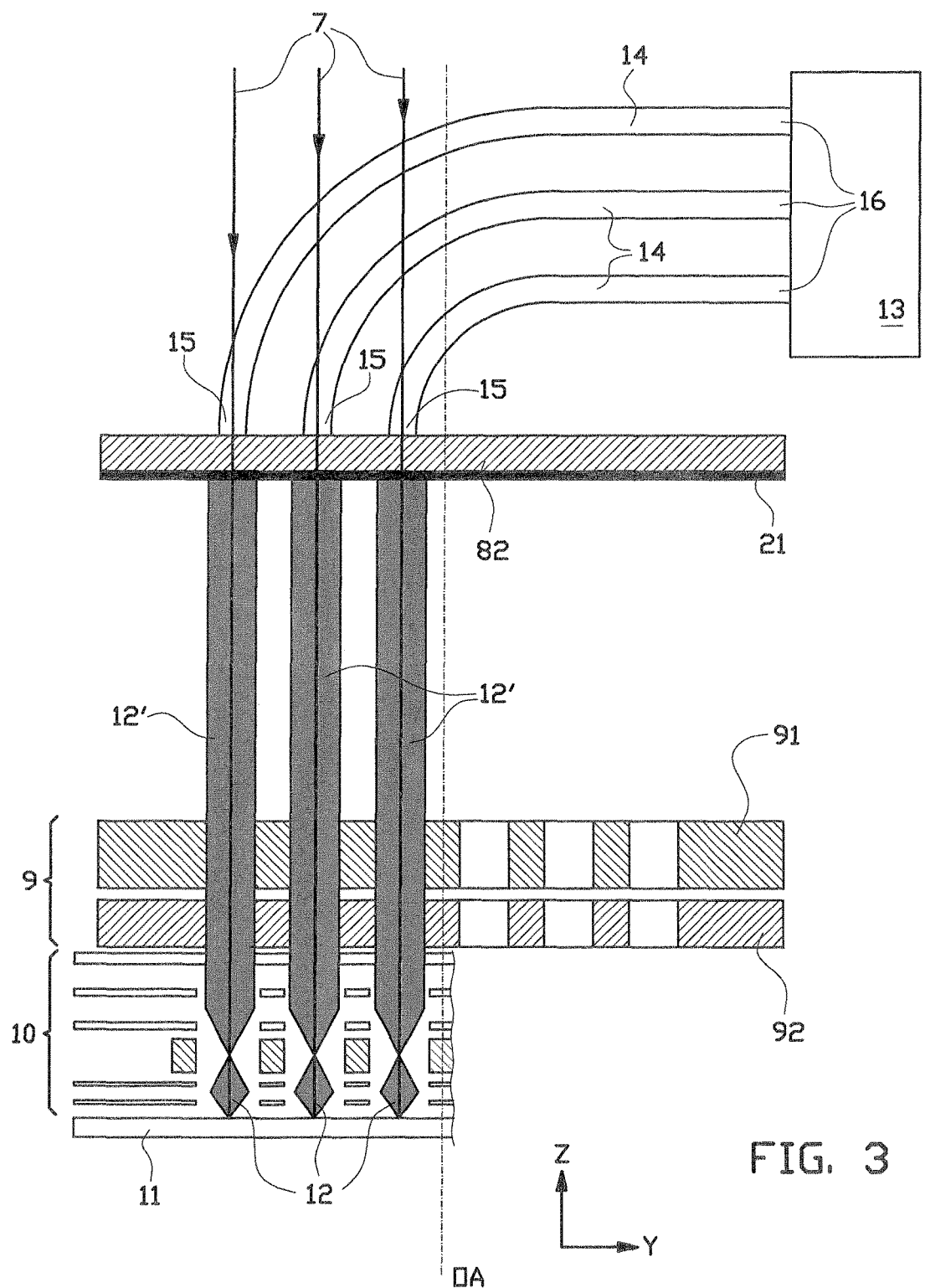
FIG. 3 schematically shows a first detailed view in the YZ plane of a part of the multi-beam charged particle column of FIG. 2.

FIGS. 2 and 3 show different views of a part of an example of a multi-beam charged particle column according to the invention. The part shown in FIGS. 2 and 3 corresponds to the particular the part of the multi-beam charged particle column 1 of FIG. 1, below the collimator lens 6. The example shown in FIGS. 2 and 3, may comprise the same upper part of the charged particle column of FIG. 1, in particular the part above the detector array 8 for producing an array of primary charged particle beams 7 which are arranged substantially parallel to the optical axis OA.

The multi-beam charged particle column 1' comprises a detector system comprising an electron-photon converter unit 81 comprising a plurality of fluorescent strips 82. The primary charged particle beams travel along their trajectories 7 through the plane of the electron-photon converter unit 81, via the openings 83 between the fluorescent strips 82, towards the deflection unit 9. The deflection unit 9 comprises one or more magnetic deflectors 91 or a combination of a magnetic deflector 91 and an electrostatic deflector 92. Preferably, the electrostatic deflector 92 is configured to at least substantially counteract the deflection of the magnetic deflector 91 for the primary charged particle beams. Accordingly, the trajectories 7' of the primary charged particle beams which have traversed the deflection unit, are shifted to a small extend in the X-direction, but are still arranged substantially parallel to the optical axis OA, and thus substantially parallel to the trajectories 7 of the primary charged particle beams above the magnetic deflection unit 9.

It is noted that in this example, the primary charged particles first traverse the magnetic deflector 91 and subsequently they traverse the electrostatic deflector 92. However, the arrangement of the magnetic deflector 91 and the electrostatic deflector 92 along the trajectory of the primary charged particles 7 can also be in reverse.

Subsequently, the primary charged particle beams 7' are focused onto a sample 11 via an objective lens unit 10.

The objective lens unit 10 comprises an electron collection unit comprising, for example, multi aperture plates for, in use, guiding signal charged particles, such as secondary electrons 12 created in the sample 11 upon incidence of the primary charged particle beams 7', from the sample 11 towards the magnetic deflection unit 9.

For the secondary electrons 12, which travel in opposite direction with respect to the primary charged particle beams 7, 7', the electrostatic deflector 92 deflects the secondary electrons 12 in the same direction as it deflects the primary electrons 7'. However, the magnetic deflector 91 deflects the secondary electrons 12 in the opposite direction as it deflects the primary electrons 7'. Accordingly, for the secondary electrons 12, the electrostatic deflector 92 and the magnetic deflector 91 do not counteract each other, but now the deflections of the secondary electrons 12 by the electrostatic deflector 92 and the magnetic deflector 91 add up. Accordingly, the secondary electrons 12' which have passed the deflection unit 9 are no longer traveling substantially parallel to the optical axis OA, but are deflected to travel at an angle with respect to the optical axis OA. The electrostatic deflector 92 and the magnetic deflector 91 are configured to provide a deflection of the secondary electrons 12' in order to project the secondary electrons 12' onto the fluorescent strips 82 of the electron-photon converter unit 81, as schematically shown in FIG. 2.

According to the example shown in the FIGS. 2 and 3, each fluorescent strip 82 is located in the plane of the electron-photon converter unit 81, next to a primary beam 7 and within a distance d equal to a pitch of the primary beams 7 at the electron-photon converter unit 81. As shown in the FIGS. 2 and 3 in particular, the multiple primary charged particle beams 7 traverses the plane of the electron-photon converter unit 81 which plane extends in a XY direction, substantially perpendicular to the optical axis OA.

It is noted that at least one strip of said plurality of fluorescent strips 82 is arranged between two adjacent primary charged particle beams 7 of said multiple primary charged particle beams.

It is further noted that in the example shown in FIGS. 2 and 3, the electron-photon converter unit 81 comprises a plurality of parallel arranged fluorescent strips 82 which extend substantially in the Y-direction. However, the electron-photon converter unit may alternatively also a plate of a fluorescent material with through holes for the primary charged particle beams 7, which plate of fluorescent material extends in the XY direction. The parts of such a plate which extend in the X or Y direction in between the through holes for the primary charged particle beams 7, are also considered to be fluorescent strips in accordance with the present invention.

At the fluorescent strips 82 of the electron-photon converter unit 81, photons are created upon incidence of the secondary electrons 12'. At least a part of said photons are transported from the fluorescent strip 82 to a photo detector 13 via a photon transport unit. In the example as shown in FIGS. 2 and 3, said photon transport unit comprises an array of optical fibers 14. Each optical fiber 14 comprises a first end 15 which is arranged adjacent or attached to one of said fluorescent strips 82 for coupling light (photons) from said fluorescent strip 82 into the optical fiber 14, and a second end 16 which is arranged to project light from said fiber 14 onto the photo detector 13.

As schematically shown in FIG. 2, the first end 15 of the optical fibers 14 of said array of optical fibers is arranged between two adjacent primary charged particle beams 7 of said multiple primary charged particle beams.

Figure 4A:
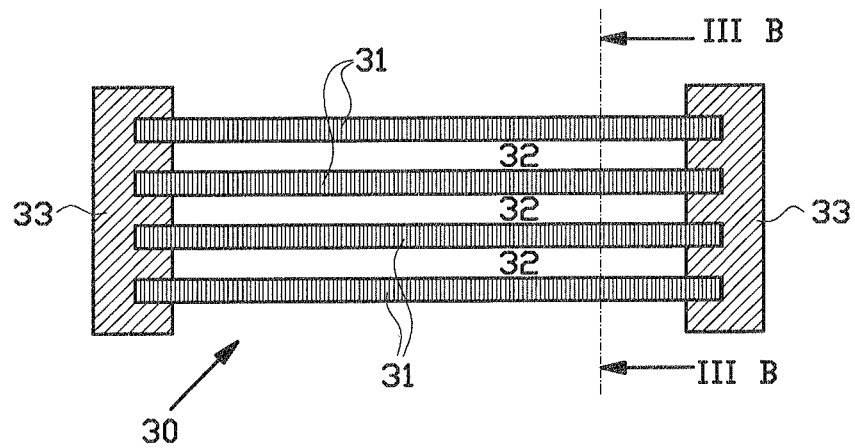
FIGS. 4A, 4B and 4C schematically show different views of a first example of a magnetic deflector according to the present invention.
Figure 4B:
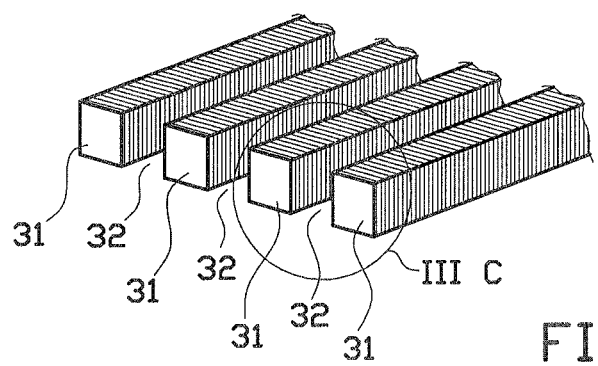
Figure 4C:
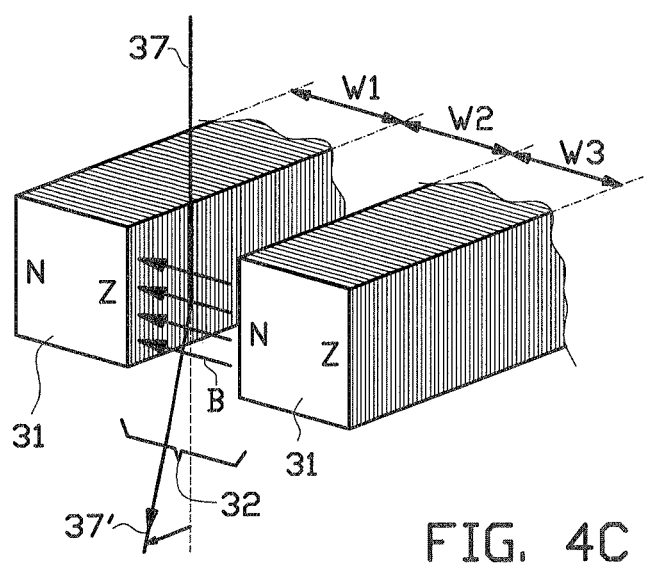

FIGS. 4A, 4B and 4C schematically show a first example of a magnetic deflector 30 according to the invention. The magnetic deflector 30 comprises a plurality of strips 31 of a magnetic material. The strips 30 are arranged in a common plane (here the plane of the paper) and are fixed at their opposite ends to a connecting member 33. The connecting members 33 hold the strips 31 parallel to each other, in particular such that the width of the gap 32 in between adjacent strips 31 is at least substantially constant over the length of the strips 31.

FIG. 4B schematically shows a cross section of the magnetic deflector 30 of FIG. 4A along the line IIIB-IIIB. FIG. 4C schematically shows an enlarged view of the part IIIC of FIG. 4B. As schematically indicated in FIG. 4C, each strip 31 comprises a north N and south Z magnetic poles which are arranged adjacent in a direction substantially parallel to the common plane of the array of strips 31. In the gap 32 in between adjacent strips 31, a magnetic field B is generated. It is noted that FIGS. 4A, 4B and 4B are not to scale. In a practice, the width W1 of the strips 31 is 0.8 mm, and the width W2 of the gap between the strips 31 is 0.2 mm. Accordingly, the magnetic field B is substantially confined in the gap 32 between the strips 31.

As schematically shown in FIG. 4C, two adjacent strips 31 of the plurality of strips are arranged at opposite sides of a trajectory of a primary charged particle beam, in this case an electron beam 37. One of said adjacent strips 31 is configured to comprise a north magnetic pole N at a side facing the trajectory of the electron beam 37, and the other one of said adjacent strips 31 is configured to comprise a south magnetic pole Z at a side facing the trajectory 37 of the electron beam 37. When the electron beam 37 is directed through the gap 32, the electron beam 37 is deflected 37' in a direction substantially parallel to the length direction of the gap 32, in particular substantially parallel to the length directions of the strips 31.

Figure 5A:
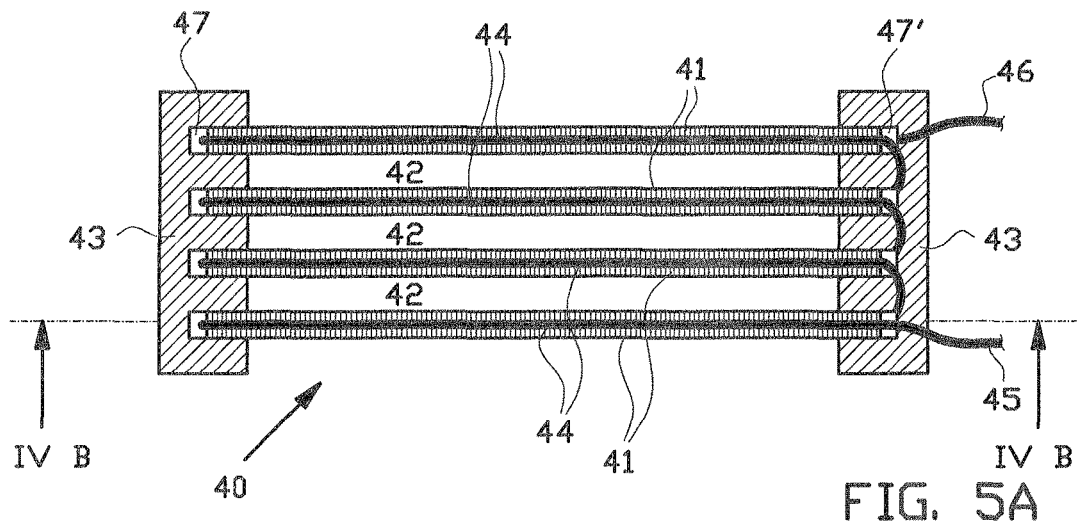
FIGS. 5A and 5B schematically show different views of a second example of a magnetic deflector according to the present invention.
Figure 5B:
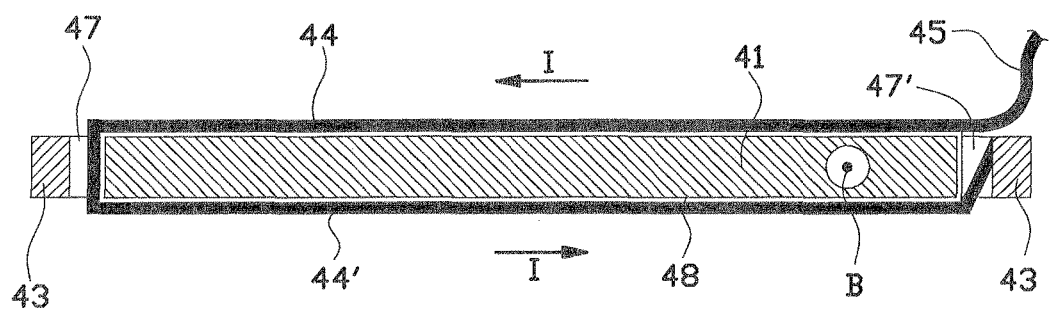

FIGS. 5A and 5B schematically show a second example of a magnetic deflector 40 according to the invention. As shown in the top view of FIG. 5A, the magnetic deflector 40 comprises a plurality of strips 41 of a ferromagnetic material which are arranged in a common plane (in FIG. 5A the common plane is in the plane of the paper). FIG. 5B shows a schematic cross-section of the magnetic deflector along the line IV B-IV B in FIG. 5A. The strips 41 are fixed at their opposite ends to a connecting member 43. The connecting members 43 hold the strips 41 parallel to each other, in particular such that the width of the gap 42 in between adjacent strips 41 is at least substantially constant over the length of the strips 41. At the opposite ends of the strips 41, through openings 47, 47' is arranged which allows pass an electrical wire from the topside of the strips 41 to the bottom side of the strips 41, or vice versa.

As schematically shown, each strip 41 is provided with at least two electric wire parts 44, 44' which extend in a direction substantially parallel to the common plane. As shown in the cross-section of FIG. 5B, the two electric wire parts 44, 44' are arranged in a plane substantially perpendicular to the common plane; one wire part 44 is arranged against the topside of the strip 41, and one wire part 44' is arranged against the bottom side of the strip 41. In the example shown in FIGS. 5A and 5B, the wire parts 44, 44' are connected in series to form one continues wire. The continues wire has an input end 45, which connects to the part of the wire 44 on the topside of a strip 41, which wire is than arranged through the through opening 47 and connects to the part of the wire 44' on the bottom side of the strip 41, which wire is than arranged through the through opening 47' and connects to the part of the wire 44 on the topside of an adjacent strip 41, which wire is than arranged through the through opening 47 at the adjacent strip 41 and connects to the part of the wire 44' on the bottom side of the adjacent strip 41, etc . . . , and the wire is than arranged through the through opening 47' and connects to the output end 46 of the wire. Accordingly, the wire 45, 44, 44', 46 is configured to provide a single coil with several loops, wherein each strip 41 is provided with and arranged inside substantially one of the loops.

In order to confine an electrical current in the wire 45, 44, 44', 46, the strips 41 of ferromagnetic material are coated with a non-conducting layer 48. Alternatively or in addition, the wire 45, 44, 44', 46 can be provided with a non-conducting cladding.

When an electrical current I is directed through the wire 45, 44, 44', 46, this electrical current I creates a magnetic field B which is concentrated inside the loops, and thus inside the strips 41 of ferromagnetic material, which acts as a magnetic core. The magnetic field B extends in a direction substantially perpendicular the loop of wire 45, 44, 44', 46, thus in a direction perpendicular to the plane of FIG. 5B and parallel to the plane of FIG. 5A. The magnitude of the magnetic field B can be controlled by adjusting the amount of current I through the loop of wire 45, 44, 44', 46. Accordingly, the amount of deflection of a charged particle beam by the magnetic deflector 40 according to this second embodiment can be adjusted, whereas the amount of deflection of a charged particle beam by the magnetic deflector 30 of FIGS. 4A, 4B and 4C is substantially constant.

The magnetic deflectors, in particular as presented in the first example of FIGS. 4A, 4B and 4C or in the second example of FIGS. 5A and 5B, can be used in a deflection unit as part of a multi-beam charged particle column as presented in the FIGS. 2 and 3.

FIGS. 6A and 6B schematically show an example of a deflection unit 60 comprising a magnetic deflector 61 and an electrostatic deflector 62.

The magnetic deflector 61 in the example of FIG. 6A corresponds essentially to the magnetic deflector as shown in FIG. 5A and in particular FIG. 5B. The magnetic deflector 61 comprises a plurality of strips 63 of a ferromagnetic material which are arranged in a common plane (corresponding to the arrangement in FIG. 5A). The strips 63 are arranged with their longitudinal axis in the X-direction, and are fixed at their opposite ends to a connecting member 64. The connecting members 64 are provided with through openings 65, 65' which allows to pass an electrical wire from the topside of the strips 63 to the bottom side of the strips 63, or vice versa. As schematically shown, the strips 63 are coated with a non-conducting layer 67 and are provided with an electric wire 66 which is arranged in a loop substantially around the strip 63. Accordingly, the wire 66 is configured to provide a single coil with several loops, each strip 63 is provided with substantially one of the loops (corresponding to the arrangement in FIGS. 5A and 5B). When an electrical current I is directed through the wire 66, this electrical current I creates a magnetic field B. The magnetic field B extends in a direction substantially perpendicular the loop of wire 66, thus in a direction perpendicular to the plane of FIG. 6A. By controlling the magnitude of the current I, the strength of the magnetic field B can be adjusted. By controlling the direction of the current I, the direction of the magnetic field B can be adjusted.

The electrostatic deflector 62 comprises a substrate 68 with several through openings 69, wherein each through opening 69 is provided with two electrodes 70. The electrodes 70 are arranged at opposite sides of the trough opening 69, at least along the X-direction. By providing a voltage difference over the electrodes 70 in each through opening 69, an electrostatic field is established inside the through openings 69. The strength of the electrostatic field inside the through openings 69 can be adjusted by controlling the magnitude of the voltage difference over the electrodes 70 in a through opening 69. The direction of the electrostatic field inside the through openings 69 can be controlled by adjusting the polarity of the voltage difference over the electrodes 70 in a through opening 69.

As shown in FIGS. 6A and 6B, the magnetic deflector 61 is spaced apart from the electrostatic deflector 62 in the Z direction. Furthermore, in the example of FIGS. 6A and 6B the trajectory of a primary electron beam 71 and a secondary electron beam 72 are schematically indicated. A primary electron beam 71 which arrives at the magnetic deflector 61 experiences a force $F_B$ due to the magnetic field in the −X direction. Subsequently, when the primary electron beam 71 arrives at the electrostatic deflector 61, the primary electron beam 71 experiences a force $F_E$ due to the electrostatic field in the +X direction. Preferably, the current I in the magnetic deflector 61 and the voltage difference in the electrostatic deflector 62 are configured to provide substantially the same amount of deflection. As schematically shown in FIGS. 6A and 6B, for the primary electron beam 71, the deflections of the magnetic deflector 61 and the electrostatic deflector 62 substantially cancel each other, such that the primary electron beam 71 before and after the magnetic deflection unit 60 are substantially parallel to each other and are substantially traveling in the −Z direction.

The returning signal charged particle beam, such as a secondary electron beam 72, is traveling upwards in the +Z direction and first arrives at the electrostatic deflector 62. The secondary electron beam 72 experiences a force $F_E'$ due to the electrostatic field also in the +X direction. Subsequently, when the secondary electron beam 72 arrives at the magnetic deflector 61, the secondary electron beam 72 experiences a force $F_B'$ in the +X direction. For the secondary electron beam 72, the deflections of the electrostatic deflector 62 and the magnetic deflector 61 add up, such that the secondary electron beam 72 after the magnetic deflection unit 60 is traveling at a sharp angle α with respect to the electron beam 72 before the magnetic deflection unit 60 and is substantially traveling in the +Z direction and in the +X direction.

It is noted that the amount of deflection, in particular the angle α, is highly exaggerated in FIGS. 6A and 6B to show the effect of the deflection. In practice, the amount of deflection is configured in order to project the secondary electron beam 72 onto the fluorescent strips 82 of the electron-photon converter unit 81 (see FIG. 2), in particular the fluorescent strip 82 adjacent to opening 83 through which the primary beam 71 which has created the secondary electrons of the secondary electron beam 72, has traveled.

Figure 7:
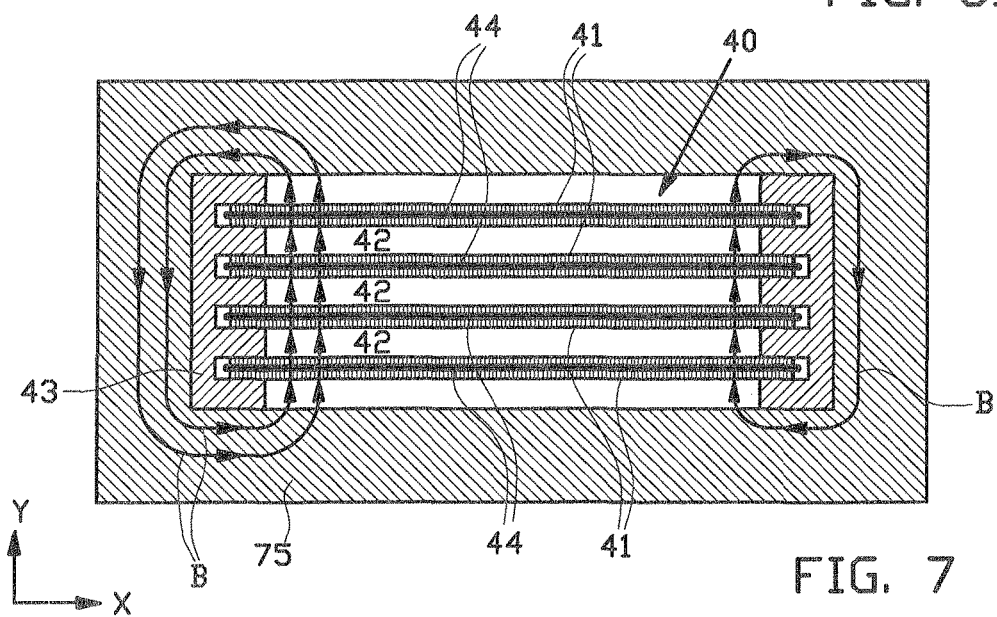

FIG. 7 shows a further elaboration of the magnetic deflector as shown in FIGS. 5A and 5B and as described above, wherein the magnetic deflection unit 40 is at least substantially surrounded by a frame 75 of ferromagnetic material which is configured to close the magnetic flux lines B outside a volume occupied by the charged particle beams. The frame 75 is arranged at least at the same level as the common plane in which the plurality of strips 41 of the magnetic deflector are arranged. The returning flux lines B are concentrated in the frame 75 and are guided by the frame 75 to go around the connecting members 43 and remain substantially in the XY plane or common plane of the plurality of strips 41. Since most of the magnetic field outside the magnetic deflector is concentrated in the frame 75 of ferromagnetic material which effectively reduces or even removes magnetic flux lines B above or below the magnetic deflector 40, a disturbance of the charged particles which traverse said magnetic deflector 40 is at least substantially reduced. The frame 75 may comprise the same ferromagnetic material as the strips 41.

It is noted that the magnetic deflector 30 of FIGS. 4A, 4B and 4C can in a similar way be provided with frame 75 as shown in FIG. 7.

Figure 8A:
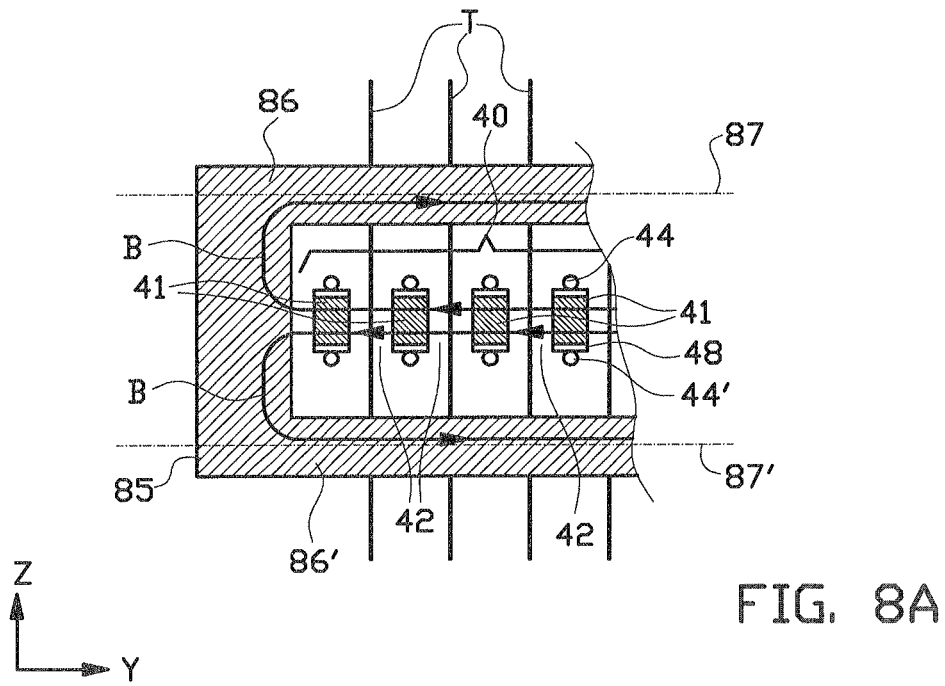
Figure 8B:
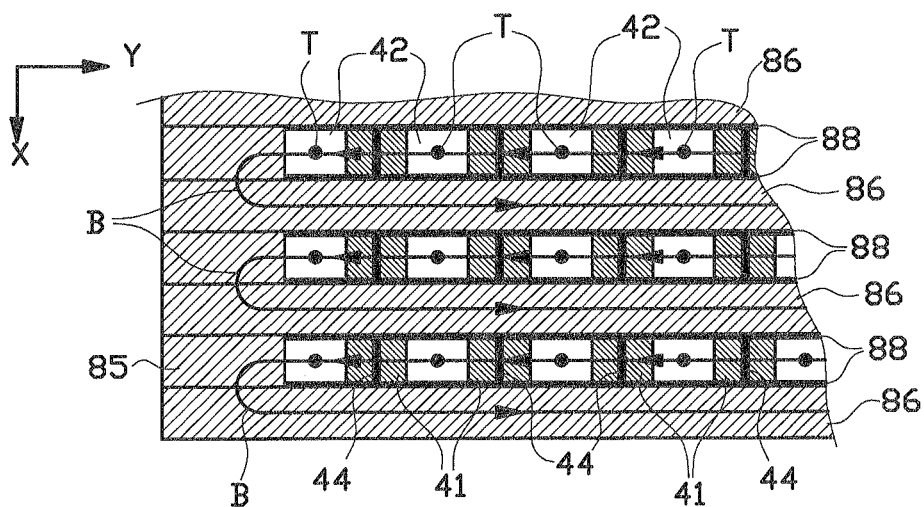

FIGS. 8A and 8B show an alternative configuration of a magnetic deflection unit 40 with a frame 85 is shown. The magnetic deflection unit 40 is at least substantially surrounded by a frame 85 of ferromagnetic material, preferably soft ferromagnetic or ferrimagnetic material, which is configured to close the magnetic flux lines B outside a volume occupied by the charged particle beams. The frame 85 of this alternative configuration is arranged at least partially above and below the magnetic deflection unit 40 as schematically shown in the cross-section of FIG. 8A. The returning flux lines B are concentrated in the frame 85 and are guided by the frame 85 to travel through frame strips 86 above and below the magnetic deflection unit 40, substantially in the YZ plane.

In order to not interfere with the trajectories of the charged particle beams which, at least in use, traverses the magnetic deflection unit 40, the frame 85 comprises a first array of frame strips 86 of ferromagnetic material arranged above the magnetic deflection unit 40 and/or a second array of frame strips 86' of ferromagnetic material arranged below the magnetic deflection unit 40. The frame strips 86, 86' are arranged spaced apart and substantially parallel to each other in a common plane 87, 87' above and below the magnetic deflection unit 40, wherein each frame strip 86, 86' is located next to a trajectory of a primary charged particle beam T and within a distance substantially equal to a pitch of the trajectories T of the primary charged particle beams at the magnetic deflection unit 40, as schematically shown in the top view of FIG. 8B.

In use, most of the magnetic field outside the magnetic deflector is concentrated in the frame 85 and the frame strips 86, 86' of ferromagnetic material which effectively reduces or even removes magnetic flux lines B above or below the magnetic deflector 40. Accordingly, a disturbance of the charged particles which traverse said magnetic deflector 40 is at least substantially reduced.

It is noted that the frame strips 86, 86' extend in a direction Y substantially perpendicular to the direction X in which the plurality of strips 41 of the magnetic deflector 40 extends. As shown in the top view of FIG. 8B, the frame strips 86 cross over the plurality of strips 41 of the magnetic deflector 40 such that the openings between the frame strips 86 and the openings between the strips 41 of the magnetic deflector 40 are in line at the trajectories T of the charged particle beams.

It is further noted that in a preferred embodiment, the frame strips 86, 86' are provided with electrodes 88. In between the electrodes 88 and the frame strips 86, 86' a non-conducting layer is arranged for electric isolation of the electrodes 88 from the frame strips 86, 86'. The electrodes 88 are arranged in the X-direction at opposite sides of the openings between the frame strips 86, 86'. By providing a voltage difference over the electrodes 88 in each through opening, an electrostatic field is established inside the openings between the frame strips 86, 86'. Accordingly, the frame 85, and in particular the frame strips 86, 86' is used as a substrate for an electrostatic deflector.

It is noted that the magnetic deflector 30 of FIGS. 4A, 4B and 4C can in a similar way be provided with frame 85 as shown in FIGS. 8A and 8B.

Figure 9:
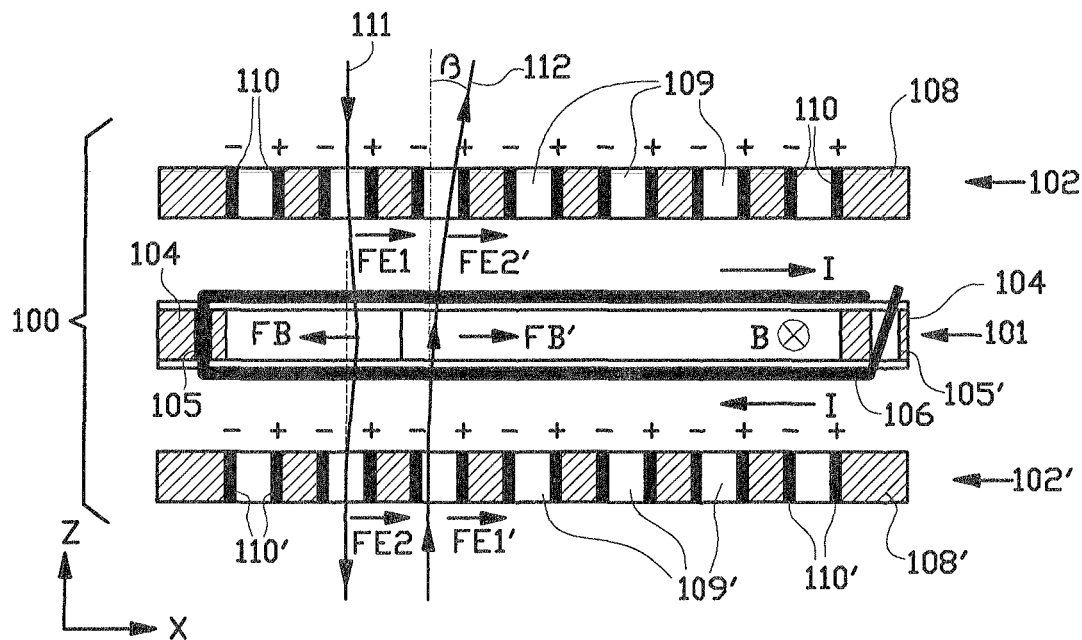

FIG. 9 schematically shows a further example of a magnetic deflection unit 100 according to the invention, which magnetic deflection unit 100 comprises a magnetic deflector 101, which is arranged in between two electrostatic deflectors 102, 102'. The electrostatic deflectors 102, 102' can be separate electrostatic deflectors or can be combined in frame strips 86, 86' of a frame 85 as shown in FIGS. 8A and 8B.

Again, the magnetic deflector 101 in the example of FIG. 9 corresponds essentially to the magnetic deflector as shown in FIG. 5A and in particular FIG. 5B. The magnetic deflector 101 comprises a plurality of strips 103 of a ferromagnetic material which are arranged in a common plane (corresponding to the arrangement in FIG. 5A). The strips 103 are arranged with their longitudinal axis in the X-direction, and are fixed at their opposite ends to a connecting member 104. The connecting members 104 are provided with through openings 105, 105' which allows to pass an electrical wire from the topside of the strips 103 to the bottom side of the strips 103, or vice versa. As schematically shown, the strips 103 are coated with a non-conducting layer 107 and are provided with an electric wire 106 which is arranged substantially around the strip 103. Accordingly, the wire 106 is configured to provide a single coil with several loops, each strip 103 is provided with substantially one of the loops (corresponding to the arrangement in FIGS. 5A and 5B). When an electrical current I is directed through the wire 106, this electrical current I creates a magnetic field B. The magnetic field B extends in a direction substantially perpendicular the loop of wire 106, thus in a direction perpendicular to the plane of FIG. 9. By controlling the magnitude of the current I, the strength of the magnetic field B can be adjusted. By controlling the direction of the current I, the direction of the magnetic field B can be adjusted.

The electrostatic deflectors 102, 102' each comprises a substrate 108, 108' with several through openings 109, 109', wherein each through opening 109, 109' is provided with two electrodes 110, 110'. The electrodes 110, 110' are arranged in the X-direction at opposite sides of the trough opening 109, 109'. By providing a voltage difference over the electrodes 110, 110' in each through opening 109, 109', and electrostatic field is established inside the through openings 109, 109'. The strength of the electrostatic field inside the through openings can be adjusted by controlling the magnitude of the voltage difference over the electrodes 110, 110' in a through opening 109, 109'.

As shown in FIG. 9, the magnetic deflector 101 is spaced apart from both the electrostatic deflectors 102, 102' in the Z direction. Furthermore, in the example of FIG. 9 the trajectory of a primary electron beam 111 and a secondary electron beam 112 are schematically indicated. A primary electron beam 111 which arrives at the upper electrostatic deflector 102 experiences a force $F_{E1}$ due to the electrostatic field and is deflected in the +X direction. Subsequently, when the primary electron beam 111 arrives at the magnetic deflector 101 it experiences a force $F_B$ due to the magnetic field and is deflected in the −X direction. Further, when the primary electron beam 111 arrives at the second electrostatic deflector 102', the primary electron beam 111 experiences a force $F_{E2}$ due to the electrostatic field and is deflected in the +X direction. Preferably, the current I in the magnetic deflector 101 and the voltage differences in the electrostatic deflectors 102, 102' are configured so that each electrostatic deflector 102, 102' provide substantially half the amount of deflection of the magnetic deflector 101. As schematically shown in FIG. 9, for the primary electron beam 111, the deflections of the magnetic deflector 101 and the electrostatic deflectors 102, 102' substantially cancel each other, such that the primary electron beam 111 after the magnetic deflection unit 100 is substantially in line with the primary electron beam 111 before the magnetic deflection unit 100.

The returning secondary electron beam 112 is traveling upwards in the +Z direction and first arrives at the second electrostatic deflector 102'. The secondary electron beam 112 experiences a force $F_{E1}'$ due to the electrostatic field and is deflected in the +X direction. Subsequently, when the secondary electron beam 112 arrives at the magnetic deflector 101, the secondary electron beam 112 experiences a force $F_B'$ due to the magnetic field and is deflected again in the +X direction. Further, when the secondary electron beam 112 arrives at the first electrostatic deflector 102, the secondary electron beam 112 experiences a force $F_{E2}'$ due to the electrostatic field and is again deflected in the +X direction. For the secondary electron beam 112, the deflections of the electrostatic deflectors 102, 102' and the magnetic deflector 101 add up, such that the secondary electron beam 112 after the magnetic deflection unit 100 is traveling at a sharp angle β with respect to the electron beam 112 before the magnetic deflection unit 100 and is substantially traveling in the +Z direction and in the +X direction.

It is noted that the amount of deflection, in particular the angle β, is highly exaggerated to show the effect of the deflection. In practice, the amount of deflection is configured in order to project the secondary electron beam 112 onto the fluorescent strips 82 of the electron-photon converter unit 81 (see FIG. 2), in particular the fluorescent strip 82 adjacent to opening 83 through which the primary beam 111 which has created the secondary electrons of the secondary electron beam 112, has traveled.

Figure 10:
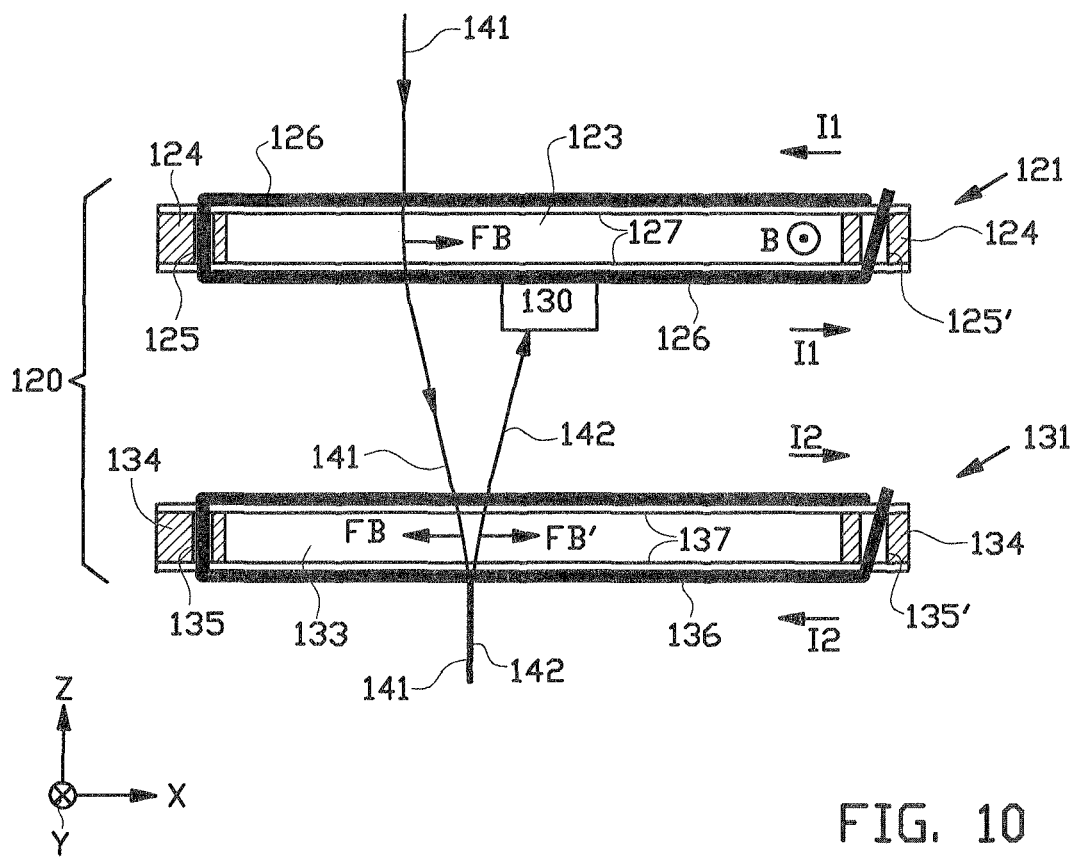

FIG. 10 schematically shows a further example of a magnetic deflection unit 120 according to the invention, which magnetic deflection unit 120 comprises two magnetic deflectors 121, 131.

Again, each magnetic deflector 121, 131 in the example of FIG. 10 corresponds essentially to the magnetic deflector as shown in FIG. 5A and in particular FIG. 5B. Each magnetic deflector 121, 131 comprises a plurality of strips 123, 133 of a ferromagnetic material which are arranged in a common plane (corresponding to the arrangement in FIG. 5A). The strips 123, 133 are arranged with their longitudinal axis in the X-direction, and are fixed at their opposite ends to a connecting member 124, 134. The connecting members 124, 134 are provided with through openings 125, 125', 135, 135' which allows to pass an electrical wire 126, 136 from the topside of the strips 123, 133 to the bottom side of the strips 123, 133, or vice versa. As schematically shown, the strips 123, 133 are coated with a non-conducting layer 127, 137 and are provided with an electric wire 126, 136 which is arranged substantially around the strip 123, 133. Accordingly, the wire 126, 136 is configured to provide a single coil with several loops, each strip 123, 133 is provided with substantially one of the loops (corresponding to the arrangement in FIGS. 5A and 5B). When an electrical current I is directed through the wire 12, 1366, this electrical current I creates a magnetic field B. The magnetic field B extends in a direction substantially perpendicular the loop of wire 126, 135, thus in a direction perpendicular to the plane of FIG. 10. By controlling the magnitude of the current I, the strength of the magnetic field B can be adjusted. By controlling the direction of the current I, the direction of the magnetic field B can be adjusted.

As schematically shown in FIG. 10, the first magnetic deflector 121 and the second magnetic deflector 131 are spaced apart in the Z direction and are arranged substantially parallel in the XY plane (FIG. 10 only shows the X direction and the +Y direction is pointing towards the paper sheet).

Furthermore, in the example of FIG. 10 the trajectory of a primary electron beam 141 and a secondary electron beam 142 are schematically indicated. A primary electron beam 141 which arrives at the first magnetic deflector 121 experiences a force $F_{B1}$ due to the magnetic field B which is generated by the current I1 through the wire 126, which deflects the primary electron beam 141 in the +X direction. Subsequently, when the primary electron beam 141 arrives at the second magnetic deflector 131 it experiences a force $F_{B2}$ due to the magnetic field B' which is generated by the current I2 through the wire 136, which deflects the primary electron beam 141 in the −X direction. Preferably, the currents I1 and I2 in the magnetic deflectors 121, 131 are configured so that each magnetic deflector 121, 131 provide the substantially the same amount of deflection, but in opposite directions. Accordingly, the primary electron beam 141 before and after the magnetic deflection unit 120 are substantially parallel to each other and are substantially traveling in the −Z direction.

The returning secondary electron beam 142 is traveling upwards in the +Z direction and arrives at the second magnetic deflector 131. At the second magnetic deflector 131, the secondary electron beam 142 experiences a force $F_{B2}'$ due to the magnetic field B' and is deflected in the +X direction, which disentangles the secondary electron beam 142 from the primary electron beam 141.

In the example shown in FIG. 10 the secondary electrons 142 are directed towards an electron detector 130 which is arranged between the first magnetic deflector 121 and the second magnetic deflector 131.

Alternatively the electron detector can also be arranged above the second magnetic deflector 121. In this case, the secondary electron beam 142 is also deflected by the first magnetic deflector 121 in the −X direction.

Figure 11:
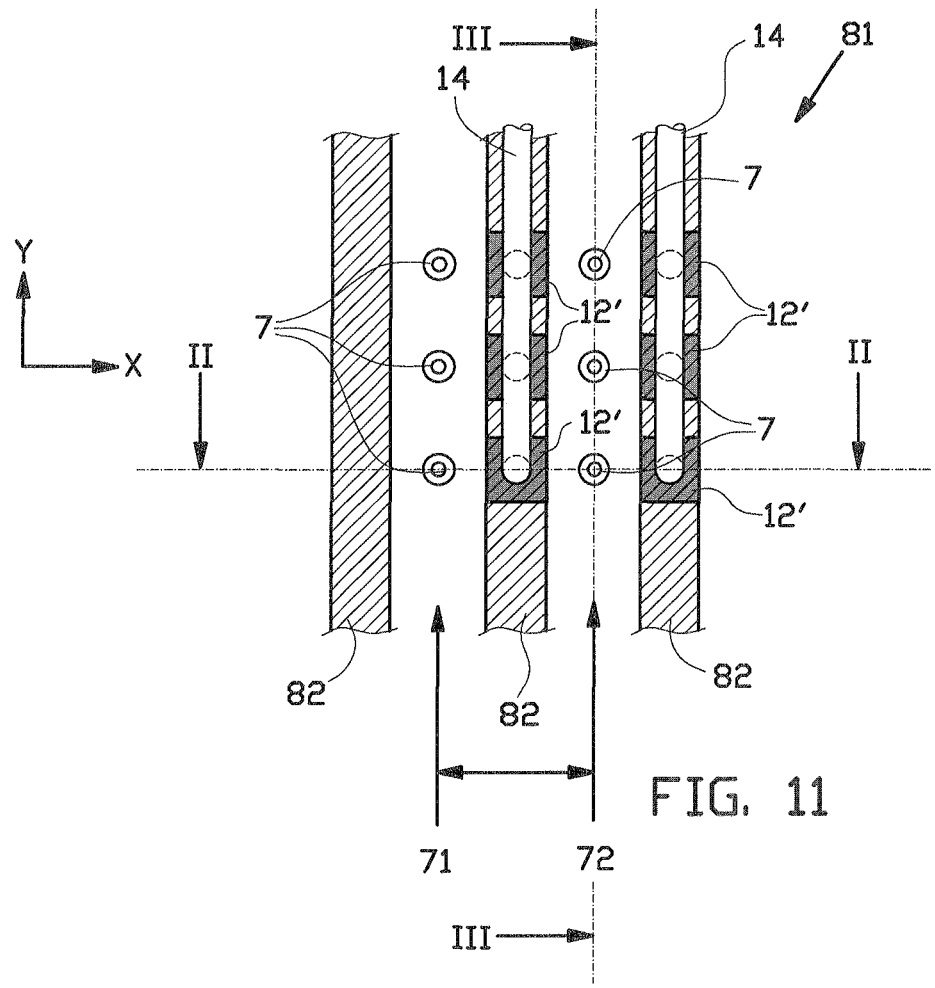

FIG. 11 shows an example of a charged particle detector arrangement comprising an electron-photon converter unit, in particular a schematic top view at the plane of the electron-photon converter unit 81, in particular in the XY plane which extends substantially perpendicular to the optical axis OA, as indicated in FIG. 2 by the reference IV-IV. As shown in FIG. 11, the multiple primary charged particle beams 7 are arranged in multiple rows 71, 72, wherein each row 71, 72 extends in a first direction, in this example in the Y-direction, substantially perpendicular to the optical axis OA as schematically shown in FIG. 3. The rows 71, 72 of primary charged particle beams 7 are arranged next to each other in a second direction, in this example in the X-direction, substantially perpendicular to said first direction and said optical axis OA. The fluorescent strips 82 of the electron-photon converter unit 81, are arranged next to a row 71, 72 of primary charged particle beams 7 and within a distance equal to a pitch d of the rows 71, 72 of the primary charged particle beams 7 at the electron-photon converter 81. As schematically indicated in FIG. 11, the openings 83 between the fluorescent strips 82 are arranged to allow passage of the primary charged particle beams 7 through the plane of the electron-photon converter unit 81.

In use, secondary electrons 12' created in the sample 11 upon incidence of the primary charged particle beams 7, are deflected by the magnetic deflection unit 9 in the X-direction and are projected onto the fluorescent strips 82 of the electron-photon converter unit 81, as schematically shown in FIG. 11. The secondary electrons 12' incident on the fluorescent strips 82 at a side facing the magnetic deflection unit 9, are converted by fluorescent material of the fluorescent strips 82 into photons (light). At a side of the fluorescent strips 82 facing away from the magnetic deflection unit 9, in particular at or near the position where the secondary electrons 12' are deflected to, optical fibers 14 are arranged to collect at least part of the created photons and to guide the collected photons a photo detector 13, as schematically shown in FIG. 3. All the optical fibers 14 which are arranged to collect the photons from the various spots of secondary electrons 12' on a specific fluorescent strip 82, are arranged above said fluorescent strip 82, in particular in a ZY plane, at least the parts of the optical fibers 14 which is arranged next to or in between the rows 71, 72 of primary charged particle beam 7. As schematically shown in FIG. 3, the optical fibers 14 are bent or curved in the YZ plane in order to arranged the second end 16 of the fibers at least out of the area of the primary charged particle beams 7 to project light from said fiber 14 onto the photo-detector 13. The bended or curved optical fibers 14 are substantially confined to the area above the fluorescent strips 82 in order to circumvent that the optical fibers 14 get in the way of the primary charged particle beams 7. The assembly of optical fibers 14 constitute a photon transport unit according to the present invention.

The photons created by the conversion of the secondary electrons 12' in the fluorescent strips 82 may also be emitted in a direction away from the first end 15 of the optical fibers 14. In order to redirect these photons back towards the first end 15 of the optical fibers 14, the fluorescent strips 82 may be coated with a photo-reflecting layer 21 at a side of said fluorescent strips 82 facing away from the first end 15 of the optical fibers 14, as schematically indicated in FIG. 3. Preferably, the photo-reflecting layer 21 is substantially transparent for the secondary electrons 12', so that at least a substantial amount of the secondary electrons 12' reach the fluorescent material of the fluorescent strips 82 and is converted into photons.

Figure 12:
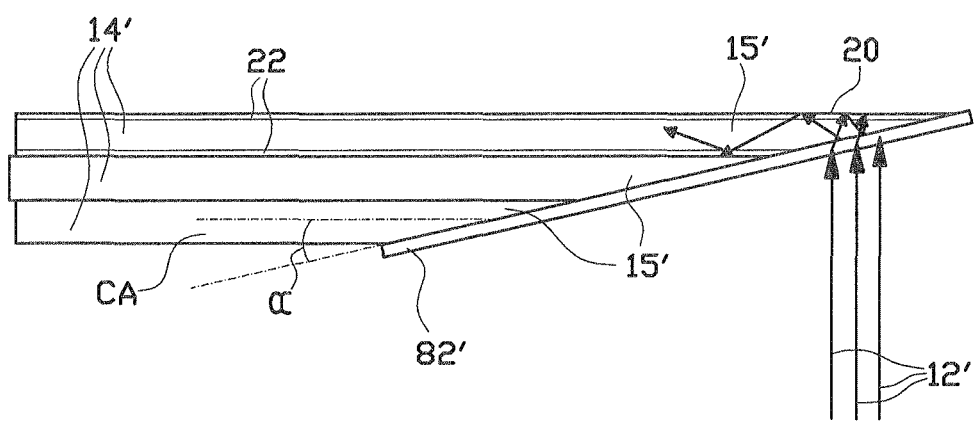

An alternative of the curved or bent optical fibers 14, is shown in FIG. 12. In this alternative example, the optical fibers 14' are tapered towards the first end 15'. The first end 15' of the optical fibers 14' are cut at an angle α between 10° and 90° with respect to an central axis CA of said fibers 14'. At the tapered first end 15' of the optical fibers 14', a fluorescent plate or a fluorescent layer 82' is arranged, which in use may be arranged instead of and at the position of the fluorescent strips 82 in the example of FIGS. 2, 3 and 11. The secondary electrons 12' which are projected onto the fluorescent plate or layer 82' are converted into photons 20. At least part of the generated photons 20 are coupled into the first end 15' of the optical fibers 14' and are conveyed or directed through said optical fiber 14' towards a photodetector. The photons 20 are confined inside optical fiber 14' due to total internal reflection at the side surface of the optical fibers 14'. Alternatively, the optical fibers 14' may be at least partially coated with a photo-reflecting layer 22, as schematically indicated at one of the fibers 14' in FIG. 12.

Figure 13:
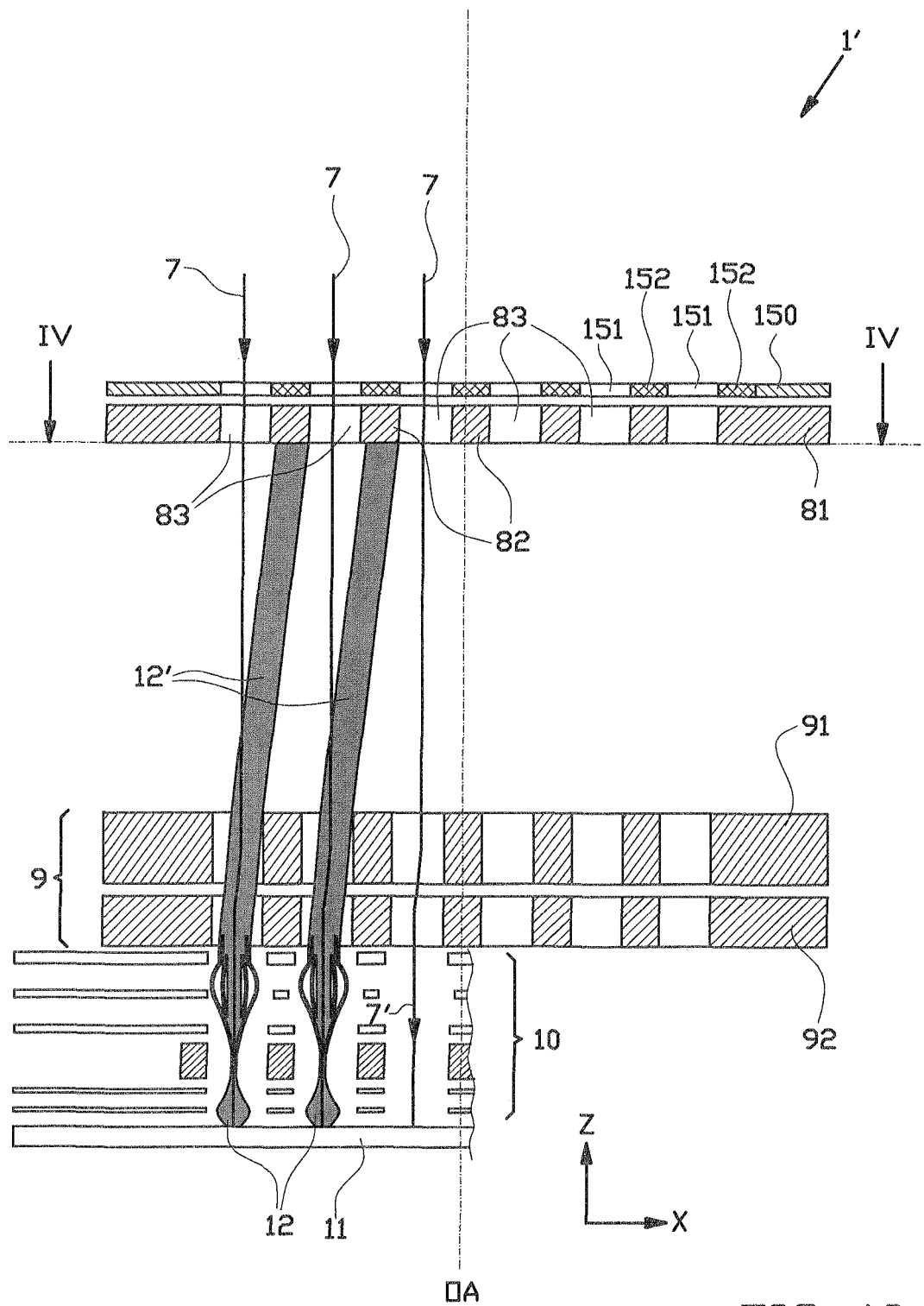

As discussed above, it is also possible to arrange the photo detector 130 directly above or on top of the electron to photon converter sections 82, as schematically shown in a second example shown in FIG. 13. According to this example, the photo detector 150 comprises an array of through holes 151 for the primary charged particle beams 7. The photo detector 150 preferably comprises an array of photo detector sections 152, each of said photo detector section 152 is arranged directly above or on top of one of the electron to photon converter sections 82. Accordingly, the photon transport unit does not need to have extra or separate components, such as optical fibers, and is essentially established by the configuration of the array of electron to photon converter sections 82 and the array of photo detector sections 152.

It is to be understood that the above description is included to illustrate the operation of embodiments and is not meant to limit the scope of the invention. From the above discussion, many variations will be apparent to one skilled in the art that would yet be encompassed by the spirit and scope of the present invention.

In summary, embodiments of the present invention relates a multi-beam charged particle column for inspecting a surface of a sample comprises a source for creating multiple primary charged particle beams which are directed towards the sample, an objective lens unit for focusing said primary charged particle beams on said sample, a detector for detecting signal charged particles from the sample, and a magnetic deflection unit arranged between the detector and the sample. The magnetic deflection unit comprises a plurality of strips of a magnetic or ferromagnetic material. At least two strips of said plurality of strips are located at opposite sides of a trajectory of a primary charged particle beam and within a distance equal to a pitch of the trajectories of the primary charged particle beams at the magnetic deflection unit. The strips are configured to establish a magnetic field having field lines substantially perpendicular to the trajectories of the primary charged particle beams.

The invention claimed is:

1. A multi-beam charged particle column for inspecting a surface of a sample, which multi-beam charged particle column comprising:

one or more emitters which are arranged for creating multiple primary charged particle beams directed along trajectories towards the surface of the sample arranged on a sample holder, an objective lens unit for focusing said multiple primary charged particle beams on said sample, a detector system for detecting signal charged particles created upon incidence of the primary charged particle beams on said sample, a magnetic deflection unit arranged between the detector system and the sample holder, wherein the magnetic deflection unit comprises a plurality of strips of a magnetic or ferromagnetic material, wherein at least one strip of said plurality of strips is located next to a trajectory of a primary charged particle beam and wherein said at least one strip is arranged within a distance equal to a pitch of the trajectories of the primary charged particle beams at the magnetic deflection unit, wherein the plurality of strips of a magnetic or ferromagnetic material is configured for establishing a magnetic field having field lines which cross the trajectories of the primary charged particle beams at an angle which is larger than 0 degrees, an electrostatic deflection member which is configured for creating an electrostatic field acting at least on the primary charged particle beams, wherein the electrostatic deflection member is configured to provide an electrostatic field in a direction at least substantially perpendicular to the magnetic field of the magnetic deflection unit, and wherein the magnetic deflection unit and the electrostatic deflection member are arranged spaced apart in a direction parallel to the trajectories of the primary charged particle beams.

2. The multi-beam charged particle column according to claim 1, wherein the plurality of strips of a magnetic or ferromagnetic material is configured for establishing that the angle between the field lines of the magnetic field and the trajectories of the primary charged particle beams is larger than 45 degrees, preferably approximately 90 degrees.

3. The multi-beam charged particle column according to claim 1, at least two strips of said plurality of strips are located at opposite sides of a trajectory of a primary charged particle beam and within a distance equal to a pitch of the trajectories of the primary charged particle beams at the magnetic deflection unit.

4. The multi-beam charged particle column according to claim 1, wherein the plurality of strips of the magnetic deflection unit are arranged in a common plane, wherein said strips comprises a magnetic material, and wherein at least one of said strips comprises a north and south magnetic poles which are arranged adjacent in a direction substantially parallel to the common plane.

5. The multi beam charged particle column according to claim 4, wherein a first strip and an adjacent second strip of said plurality of strips are arranged at opposite sides of at least one of said trajectories of the primary charged particle beams, wherein the first strip is configured to comprise a north magnetic pole at a side facing the trajectory of the primary charged particle beam, and wherein the second strip is configured to comprise a south magnetic pole at a side facing the at least one of said trajectories of the primary charged particle beams.

6. The multi-beam charged particle column according to claim 1, wherein the plurality of strips of the magnetic deflection unit are arranged in a common plane, wherein said strips comprises a ferromagnetic material, and wherein at least one of said strips is provided with at least two electric wires which extend in a direction substantially parallel to the common plane, wherein the two electric wires are arranged in a plane substantially perpendicular to the common plane, and wherein the magnetic deflection unit is configured to provide an electrical current to the two electric wires wherein the electrical current is configured to flow through the two electric wires in opposite direction.

7. The multi-beam charged particle column according to claim 6, wherein the two electric wires are part of a single loop, preferably wherein the two electric wires are part of a single coil.

8. The multi-beam charged particle column according to claim 1, wherein the detector system comprises a plurality of detector sections, wherein at least one detector section of said plurality of detector sections is located next to a trajectory of a primary charged particle beam and within a distance equal to a pitch of the primary charged particle beams at the detector system.

9. The multi-beam charged particle column according to claim 8, wherein the magnetic deflection unit is configured for separating said primary charged particle beam and said signal charged particles at a position of the detector system over a distance between 10% and 90% of the pitch of the trajectories of said primary charged particle beams.

10. The multi-beam charged particle column according to claim 1, wherein the detector system comprises:
  an electron-photon converter unit comprising a plurality of electron to photon converter sections, wherein at least one electron to photon converter section of said plurality of electron to photon converter sections is located next to a trajectory of a primary charged particle beam and within a distance equal to a pitch of trajectories of the primary charged particle beams at the electron-photon converter unit,
  a photon transport unit for transporting light from said electron to photon converter sections to a light detector.

11. The multi-beam charged particle column according to claim 1, wherein the magnetic deflection unit is at least substantially surrounded by a frame of ferromagnetic material, which is configured to close magnetic flux lines outside a volume occupied by the trajectories of the primary charged particle beams.

12. The multi-beam charged particle column according to claim 11, wherein the frame is arranged at least partially above and/or below the magnetic deflection unit, wherein the frame comprises an array of frame strips of ferromagnetic material, wherein the strips are spaced apart and substantially parallel to each other in a common plane above and/or below the magnetic deflection unit in order to allow the primary charged particle beams to pass through the openings between the frame strips.

13. The multi-beam charged particle column according to claim 12, wherein each frame strip is located next to a trajectory of a primary charged particle beam and within a distance substantially equal to a pitch of the trajectories of the primary charged particle beams at the magnetic deflection unit.

14. The multi-beam charged particle column according to claim 12, wherein the frame strips are provided with electrodes which are configured for providing the electrostatic deflection member, wherein the electrostatic deflection member is configure for providing an electrostatic field in or at the opening between the frame strips.

15. The multi-beam charged particle column according to claim 1, wherein the electrostatic deflection member is configured to provide an electrostatic field in a direction at least substantially parallel to at least one strip of the plurality of strips of a magnetic or ferromagnetic material.

16. The multi-beam charged particle column according to claim 1, wherein the electrostatic deflection member is configured to direct both the electrostatic field and the magnetic field to extend substantially in a plane substantially perpendicular to the trajectories of the primary charged particle beams at the magnetic deflection unit.

17. The multi-beam charged particle column according to claim 1, wherein the electrostatic deflection member is configured to provide an electrostatic field which at least substantially compensates a deflection of the primary charged particle beams by the magnetic field.

18. The multi-beam charged particle column according to claim 1, wherein the electrostatic deflection member is arranged adjacent to the strips of a magnetic or ferromagnetic material, at least in a direction parallel to the trajectories of the primary charged particle beams.

19. The multi-beam charged particle column according to claim 1, wherein the magnetic deflection unit and the electrostatic deflection unit are connected to each other, preferably to form a magnetic deflection and electrostatic deflection unit.

20. A combined magnetic deflection unit and electrostatic deflection unit,
  wherein the magnetic deflection unit comprises a plurality of strips of a magnetic or ferromagnetic material, wherein the strips of said plurality of strips are arranged spaced apart and in a common plane, wherein the plurality of strips of a magnetic or ferromagnetic material is configured to establish a magnetic field in between the strips having field lines which extend substantially parallel to said common plane,
  wherein the electrostatic deflection unit comprises a series of electrode strips of a conductive material arranged spaced apart and in a second common plane, which the series of electrode strips are configured to establish an electrostatic field in between said electrode strips having field lines which extend substantially parallel to said second common plane and substantially perpendicular to the field lines of the magnetic field, and
  wherein the first common plane and the second common plane are arranged spaced apart.

21. The combined magnetic deflection unit and electrostatic deflection unit according to claim 20 being configured for use in a multi-beam charged particle column, comprising:
  one or more emitters which are arranged for creating multiple primary charged particle beams directed along trajectories towards the surface of the sample arranged on a sample holder,
  an objective lens unit for focusing said multiple primary charged particle beams on said sample,
  a detector system for detecting signal charged particles created upon incidence of the primary charged particle beams on said sample, and
  wherein the combined magnetic deflection unit and electrostatic deflection unit is arranged between the detector system and the sample holder, wherein each strip of said plurality of strips is located next to a trajectory of a primary charged particle beam and within a distance equal to a pitch of the trajectories of the primary charged particle beams at the magnetic deflection unit, wherein the plurality of strips of a magnetic or ferromagnetic material is configured to establish a magnetic field having field lines which cross a trajectory of the primary charged particle beams at an angle which is larger than 0 degrees.

22. The combined magnetic deflection unit and electrostatic deflection unit of claim 20, wherein the first common plane and the second common plane are arranged substantially parallel to each other, and/or wherein the magnetic deflector unit and the electrostatic deflection unit are formed as one unit.

23. Use of a multi-beam charged particle column, for at least one of inspecting and imaging a surface of a sample, the multi-beam charged particle column comprising the steps of:
creating multiple primary charged particle beams directed along trajectories towards the surface of the sample arranged on a sample holder using one or more emitters,
focusing said multiple primary charged particle beams on said sample using an objective lens unit,
detecting signal charged particles created upon incidence of the primary charged particle beams on said sample using a detector system, and
using a combined magnetic deflection unit and electrostatic deflection unit arranged between the detector system and the sample holder, wherein the magnetic deflection unit comprises a plurality of strips of a magnetic of ferromagnetic material, wherein each strip of said plurality of strips is located next to a trajectory of a primary charged particle beam and within a distance equal to a pitch of the trajectories of the primary charged particle beams at the magnetic deflection unit, wherein the plurality of strips of a magnetic or ferromagnetic material establishes a magnetic field having field lines which cross a trajectory of the primary charged particle beams at an angle which is larger that 0 degrees, wherein the electrostatic deflection unit creates an electrostatic field acting at least on the primary charged particle beams, wherein the electrostatic deflection member provides an electrostatic field in a direction at least substantially perpendicular to the magnetic field of the magnetic deflection unit, and wherein the magnetic deflection unit and the electrostatic deflection unit are arranged spaced apart in a direction parallel to the trajectories of the primary charged particle beams.

24. A method for inspecting or imaging a surface of a sample, comprising the steps of:
creating multiple primary charged particle beams directed along trajectories towards the surface of the sample arranged on a sample holder,
focusing said multiple primary charged particle beams on said sample,
establishing a magnetic field having field lines which cross a trajectory of the primary charged particle beams at an angle which is larger than 0 degrees, by using a magnetic deflection unit arranged between the detector system and the sample holder, wherein the magnetic deflection unit comprises a plurality of strips of a magnetic or ferromagnetic material, wherein each strip of said plurality of strips is located next to a trajectory of a primary charged particle beam and within a distance equal to a pitch of the trajectories of the primary charged particle beams at the magnetic deflection unit,
establishing an electrostatic field acting at least on the primary charged particle beams, wherein the electrostatic field is configured to have field lines in the direction at least substantially perpendicular to the magnetic field, wherein a magnetic deflection unit for generating said magnetic field and the electrostatic deflection unit for the generating said electrostatic field are arranged spaced apart in a direction parallel to the trajectories of the primary charged particle beams, and
detecting signal charged particles created upon incidence of the primary charged particle beams on said sample, by using a detector system.

* * * * *